US008133550B2

(12) United States Patent
Sato et al.

(10) Patent No.: US 8,133,550 B2
(45) Date of Patent: Mar. 13, 2012

(54) POLYBENZOXAZOLE PRECURSOR, PHOTOSENSITIVE RESIN COMPOSITION USING THE SAME, AND MANUFACTURING METHOD OF SEMICONDUCTOR DEVICE

(75) Inventors: Kenichiro Sato, Haibara-gun (JP); Tsukasa Yamanaka, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 770 days.

(21) Appl. No.: 11/855,302

(22) Filed: Sep. 14, 2007

(65) Prior Publication Data

US 2008/0076849 A1 Mar. 27, 2008

(30) Foreign Application Priority Data

Sep. 19, 2006 (JP) ................................. 2006-253001

(51) Int. Cl.
*C08J 7/04* (2006.01)
*G03F 7/00* (2006.01)
*G03F 7/26* (2006.01)

(52) U.S. Cl. ..................... 427/510; 430/270.1; 430/189; 522/164; 522/167; 528/335

(58) Field of Classification Search .................. 427/510; 522/164, 167; 430/286.1, 270.1, 189; 528/335
See application file for complete search history.

(56) References Cited

U.S. PATENT DOCUMENTS

| | | | |
|---|---|---|---|
| 5,376,499 A * | 12/1994 | Hammerschmidt et al. | 430/192 |
| 6,518,390 B2 * | 2/2003 | Okanuma et al. | 528/176 |
| 6,607,865 B2 * | 8/2003 | Makabe et al. | 430/191 |
| 6,824,949 B2 * | 11/2004 | Haussmann et al. | 430/170 |
| 7,049,371 B2 * | 5/2006 | Enoki et al. | 525/183 |
| 7,052,936 B2 * | 5/2006 | Walter et al. | 438/118 |
| 7,220,520 B2 * | 5/2007 | Naiini et al. | 430/18 |
| 7,368,216 B2 * | 5/2008 | Sato et al. | 430/191 |
| 7,416,822 B2 * | 8/2008 | Kanada et al. | 430/18 |
| 7,598,009 B2 * | 10/2009 | Sato et al. | 430/18 |
| 7,608,928 B2 * | 10/2009 | Shirato et al. | 257/760 |
| 7,615,324 B2 * | 11/2009 | Sato et al. | 430/18 |
| 7,615,331 B2 * | 11/2009 | Yamanaka et al. | 430/270.1 |
| 7,803,510 B2 * | 9/2010 | Naiini et al. | 430/190 |
| 2002/0076535 A1 | 6/2002 | Cooray | |
| 2004/0076902 A1 | 4/2004 | Nakanishi et al. | |
| 2004/0152862 A1 | 8/2004 | Takasaki et al. | |
| 2007/0154843 A1 | 7/2007 | Kanada et al. | |
| 2008/0206548 A1 * | 8/2008 | Enoki et al. | 428/319.3 |

FOREIGN PATENT DOCUMENTS

| | | |
|---|---|---|
| JP | 5-197153 A | 8/1993 |
| JP | 2000-169582 A | 6/2000 |
| JP | 2002-53664 A | 2/2002 |
| JP | 2002-138248 A | 5/2002 |
| JP | 2003-122013 A | 4/2003 |
| JP | 2003-241377 A | 8/2003 |
| JP | 2003-241378 A | 8/2003 |
| JP | 2003-248314 A | 9/2003 |
| JP | 2004-132994 A | 4/2004 |
| JP | 2004-157248 A | 6/2004 |
| JP | 2005-249847 A | 9/2005 |
| WO | 03/010223 A1 | 2/2003 |
| WO | 2005/068535 A1 | 7/2005 |

OTHER PUBLICATIONS

JP 2002-53664 A, machine translation from JPO web site, Feb. 19, 2002.*
JP 2002-53664 A Abstract from JPO web site, Feb. 29, 2002.*
Machine Translation obtained from the PAJ website, pp. 1-21, of JP 2004-157248 A, published Jun. 3, 2004.*
Japanese Office Action issued Jun. 22, 2010 in corresponding Japanese application No. 2006-253001.
Notification dated Jan. 25, 2011 in Japanese Patent Application (JPA) No. 2006-253001 and third party Submission Publications in JPA No. 2006-253001 dated Dec. 27, 2010.
Office Action dated Mar. 1, 2011 in Japanese Patent Application No. 2006-253001.
Third Party Information Statement filed Jul. 13, 2011 in Japanese Application No. 2006-253001.
Official Notification dated Aug. 4, 2011 in Japanese Application No. 2006-253001.

* cited by examiner

*Primary Examiner* — Susan W Berman
(74) *Attorney, Agent, or Firm* — Sughrue Mion, PLLC

(57) ABSTRACT

A polybenzoxazole precursor is represented by the following formula (1):

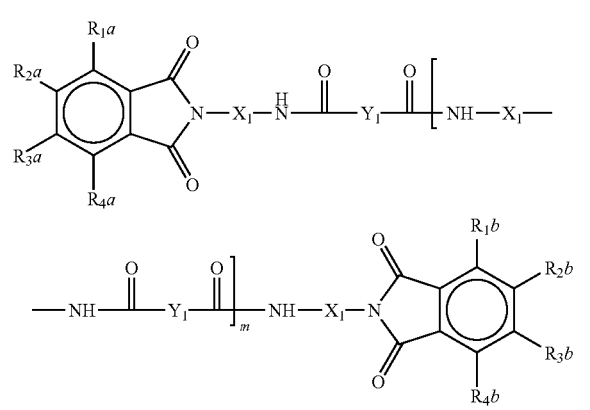

wherein $R_1a$ to $R_4a$, $R_1b$ to $R_4b$, $X_1$, $Y_1$ and m are defined in the specification.

6 Claims, No Drawings

POLYBENZOXAZOLE PRECURSOR, PHOTOSENSITIVE RESIN COMPOSITION USING THE SAME, AND MANUFACTURING METHOD OF SEMICONDUCTOR DEVICE

BACKGROUND OF THE INVENTION

1. Field of the Invention

The present invention relates to a polybenzoxazole precursor and a photosensitive resin composition, and more specifically relates to a positive photosensitive resin composition suitable for application to the field of the techniques of microelectronic elements and capable of development with an alkali aqueous solution, and a method for manufacturing a semiconductor device using the same.

2. Description of the Related Art

In the field of the techniques of microelectronic elements, polymers that show durability at high temperature are generally well known. The precursors of these polymers such as polyimide and polybenzoxazole (PBO) can be made photoreactive with proper additives. The precursors are converted to polyimide and polybenzoxazole (PBO) by known techniques such as exposure to high temperature. Accordingly, the polymer precursors are used for the manufacture of a protective layer, a thermal insulating layer, and a highly heat resisting polymer relief structure.

As disclosed in JP-A-5-197153 (The term "JP-A" as used herein refers to an "unexamined published Japanese patent application".), JP-A-2003-241377, JP-A-2003-241378, JP-A-2003-248314 and JP-A-2002-53664, various examinations have been done for contriving the improvement of photosensitive compositions containing PBO precursors by capping the terminals of PBO precursors with an unsaturated group such as an alkenyl group or an alkynyl group, a cyclic compound group, or an acid group such as a carboxylic acid residue.

Photosensitive compositions containing a PBO precursor are characterized in that they are higher sensitivity, a film remaining rate after development is large, and they have high resolution. However, since stable pattern formation is difficult if a pattern size is fluctuated at the heating time after lithographic process, which is a problem remaining to be improved. It is also desired for a film formed to have high breaking elongation.

SUMMARY OF THE INVENTION

The invention provides a polybenzoxazole precursor and a photosensitive resin composition capable of forming a relief structure having good breaking elongation characteristics, achievable high sensitivity and high film remaining rate, little in pattern size fluctuation at the heating time after lithographic process, capable of stable pattern formation, and capable of forming a film having high breaking elongation, and also provides a method for manufacturing a semiconductor device using the composition.

The above objects have been achieved by the following structures.

<1> A polybenzoxazole precursor represented by the following formula (1):

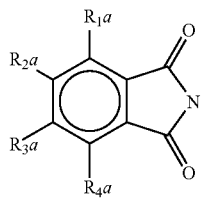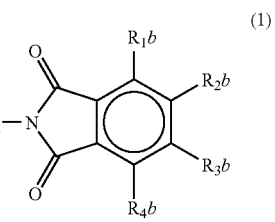

(1)

wherein $R_1a$, $R_2a$, $R_3a$, $R_4a$, $R_1b$, $R_2b$, $R_3b$ and $R_4b$ may be the same or different, each of them represents a hydrogen atom, an alkyl group, an alkoxy group, an alkynyl group, or an alicyclic group, at least one of $R_1a$ to $R_4a$ and at least one of $R_1b$ to $R_4b$ represent an alkynyl group, and the groups other than an alkynyl group of $R_1a$ to $R_4a$ and the groups other than an alkynyl group of $R_1b$ to $R_4b$ may be bonded to each other to form an alicyclic group;

$X_1$ represents a group represented by formula (2) or (3):

(2)

(3)

$X_2$ represents a divalent aromatic group, heterocyclic group, alicyclic group, or aliphatic group, each of which may contain a silicon atom;

$X_3$ represents a tetravalent aromatic group, aliphatic group, heterocyclic group, or mixed group thereof;

Ra and Rb each independently represents a hydrogen atom, an alkyl group, an acyl group, $SO_2Rc$, a group capable of leaving by the action of an acid, or $—C(R_3)_2—COOR_4$;

Rc represents an alkyl group, an aryl group, or an alicyclic group;

$R_3$ represents a hydrogen atom or an alkyl group having from 1 to 4 carbon atoms;

$R_4$ represents a group capable of leaving by the action of an acid;

$Y_1$ represents a divalent aromatic group, aliphatic group, heterocyclic group, or mixed group thereof;

each groups represented by $X_1$, $X_2$, $X_3$, $Y_1$, Ra, Rb, Rc, $R_3$ and $R_4$ may be the same or different; and m represents an integer of from 3 to 1,000.

<2> A photosensitive resin composition comprising:
a photosensitizer; and
a polybenzoxazole precursor represented by the following formula (1):

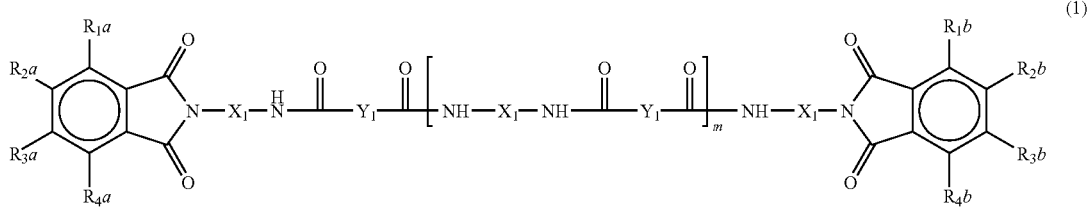

wherein $R_1a$, $R_2a$, $R_3a$, $R_4a$, $R_1b$, $R_2b$, $R_3b$ and $R_4b$ may be the same or different, each of them represents a hydrogen atom, an alkyl group, an alkoxy group, an alkynyl group, or an alicyclic group, at least one of $R_1a$ to $R_4a$ and at least one of $R_1b$ to $R_4b$ represent an alkynyl group, and the groups other than an alkynyl group of $R_1a$ to $R_4a$ and the groups other than an alkynyl group of $R_1b$ to $R_4b$ may be bonded to each other to form an alicyclic group;

$X_1$ represents a group represented by formula (2) or (3):

$X_2$ represents a divalent aromatic group, heterocyclic group, alicyclic group, or aliphatic group, each of which may contain a silicon atom;

$X_3$ represents a tetravalent aromatic group, aliphatic group, heterocyclic group, or mixed group thereof;

Ra and Rb each independently represents a hydrogen atom, an alkyl group, an acyl group, $SO_2Rc$, a group capable of leaving by the action of an acid, or $-C(R_3)_2-COOR_4$;

Rc represents an alkyl group, an aryl group, or an alicyclic group;

$R_3$ represents a hydrogen atom or an alkyl group having from 1 to 4 carbon atoms;

$R_4$ represents a group capable of leaving by the action of an acid;

$Y_1$ represents a divalent aromatic group, aliphatic group, heterocyclic group, or mixed group thereof;

each groups represented by $X_1$, $X_2$, $X_3$, $Y_1$, Ra, Rb, Rc, $R_3$ and $R_4$ may be the same or different; and m represents an integer of from 3 to 1,000.

<3> The polybenzoxazole precursor as described in <1>, wherein at least one of the groups represented by $X_1$ and the groups represented by $Y_1$ in the formula (1) comprises a structure represented by the following formula (A2-2):

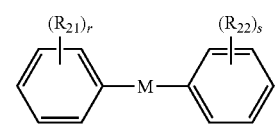

wherein M represents a single bond or a divalent group;
$R_{21}$ and $R_{22}$ each independently represents a fluorine atom or a univalent organic group; and
r and s each independently represents an integer of from 1 to 4.

<4> The photosensitive resin composition as described in <2>,
wherein at least one of the groups represented by $X_1$ and the groups represented by $Y_1$ in the formula (1) comprises a structure represented by the following formula (A2-2):

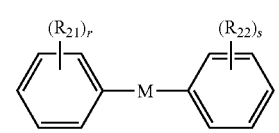

wherein M represents a single bond or a divalent group;
$R_{21}$ and $R_{22}$ each independently represents a fluorine atom or a univalent organic group; and
r and s each independently represents an integer of from 1 to 4.

<5> A manufacturing method of a semiconductor device comprising:
a processes of coating the photosensitive resin composition as described in <2> on a semiconductor element;
a process of prebaking;
a process of exposure;
a process of development; and
a process of heating.

DETAILED DESCRIPTION OF THE INVENTION

[1] A polybenzoxazole precursor having a structure represented by formula (1):
A polybenzoxazole precursor represented by formula (1) in the invention is described below.

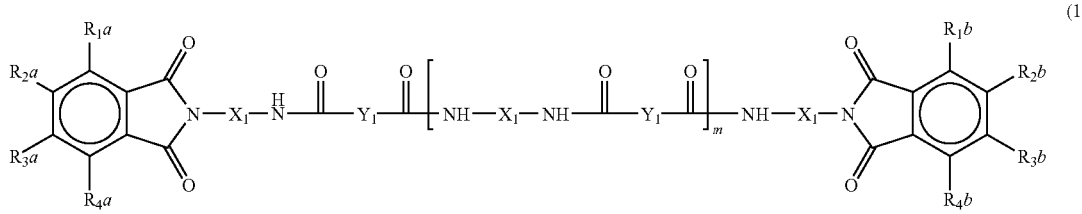

In formula (1), $R_1a$ to $R_4a$ and $R_1b$ to $R_4b$, which may be the same or different, each represents a hydrogen atom, an alkyl group, an alkoxy group, an alkynyl group, or an alicyclic group, provided that at least one of $R_1a$ to $R_4a$ and at least one of $R_1b$ to $R_4b$ represent an alkynyl group, and in connecting with $R_1a$ to $R_4a$ or $R_1b$ to $R_4b$, groups other than an alkynyl group may be bonded to each other to form an alicyclic group.

In connection with each of $R_1a$ to $R_4a$ and $R_1b$ to $R_4b$, the number of alkynyl group is preferably from 1 to 3, and especially preferably 1.

In formula (1), the alkyl group represented by $R_1a$ to $R_4a$ and $R_1b$ to $R_4b$ preferably has from 1 to 10 carbon atoms, and more preferably from 1 to 4 carbon atoms, the alkoxy group preferably has from 1 to 10 carbon atoms, and more preferably from 1 to 4 carbon atoms, the alkynyl group preferably has from 2 to 10 carbon atoms, and more preferably from 2 to 4 carbon atoms, and the alicyclic group preferably has from 3 to 10 carbon atoms, and more preferably from 3 to 6 carbon atoms.

Each group represented by $R_1a$ to $R_4a$ and $R_1b$ to $R_4b$ may have a substituent. As the substituents, an alkoxy group, an alicyclic group, an aromatic group and a halogen atom are exemplified, and the number of carbon atoms is preferably 10 or less.

At least one of $R_1a$ to $R_4a$ and at least one of $R_1b$ to $R_4b$ represent an alkynyl group, and groups other than an alkynyl group represented by $R_1a$ to $R_4a$ or $R_1b$ to $R_4b$ may be bonded to each other to form an alicyclic group. The alicyclic group in this case is the same as the alicyclic group represented by $R_1a$ to $R_4a$ or $R_1b$ to $R_4b$.

As the alkyl groups, e.g., methyl, ethyl, propyl, isopropyl, butyl and isobutyl can be exemplified. As the alkoxy groups, e.g., methoxy, ethoxy, propoxy and butoxy can be exemplified. As the alicyclic groups, e.g., cyclopentyl, cyclohexyl, norbornyl, adamantyl and tricyclodecanyl can be exemplified.

The alkynyl group is, e.g., represented by the following formula.

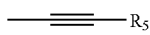

In the above formula, $R_5$ represents a hydrogen atom, an alkyl group, e.g., methyl, ethyl, propyl or the like, an aryl group, e.g., phenyl, toluoyl or the like, an aralkyl group, e.g., benzyl, phenethyl or the like, or an alicyclic group, e.g., cyclopentyl, cyclohexyl, norbornyl or the like.

As the preferred groups of the alkynyl group represented by the above formula, the following groups can be exemplified, but the invention is not restricted thereto.

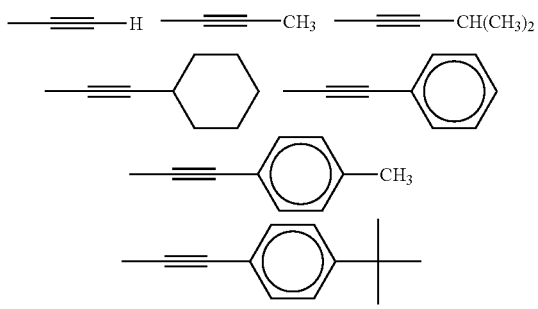

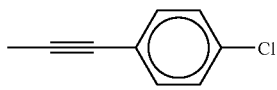

$Y_1$ represents a divalent aromatic group, aliphatic group, heterocyclic group, or mixed group thereof, and an aromatic group or an aromatic heterocyclic group is preferred.

$X_1$ represents a group represented by formula (2) or (3):

In the above formulae, $X_3$ represents a tetravalent aromatic group, aliphatic group, heterocyclic group, or mixed group thereof, and an aromatic group or an aromatic heterocyclic group is preferred.

Ra and Rb each represents a hydrogen atom, an alkyl group, an acyl group, $SO_2Rc$ (where Rc represents an alkyl group, an aryl group, or an alicyclic group), a group capable of leaving by the action of an acid, or $-C(R_3)_2-COOR_4$ (where $R_3$ represents a hydrogen atom or an alkyl group having from 1 to 4 carbon atoms, and $R_4$ represents a group capable of leaving by the action of an acid).

$X_2$ represents a divalent aromatic group, heterocyclic group, alicyclic group, or aliphatic group, each of which groups may contain a silicon atom, and an aromatic group or an alkylene group is preferred.

Ra and Rb each represents a hydrogen atom, an alkyl group (preferably having from 1 to 10 carbon atoms, e.g., methyl, ethyl, propyl, isopropyl, butyl, isobutyl), an acyl group (preferably having from 1 to 10 carbon atoms, e.g., formyl, acetyl, propanoyl, butanoyl, isobutyryl, pentanoyl), $SO_2Rc$ (where Rc represents an alkyl group (preferably having from 1 to 10 carbon atoms, e.g., methyl, ethyl, propyl, isopropyl, butyl, isobutyl), an aryl group (preferably having from 6 to 14 carbon atoms, e.g., phenyl, toluoyl, mesityl), or an alicyclic group (having from 3 to 15 carbon atoms, e.g., cyclopentyl, cyclohexyl, norbornyl, adamantyl)), a group capable of leaving by the action of an acid, or $-C(R_3)_2-COOR_4$ (where $R_3$ represents a hydrogen atom or an alkyl group having from 1 to 4 carbon atoms, and $R_4$ represents a group capable of leaving by the action of an acid).

m represents from 3 to 1,000.

As the group capable of leaving by the action of an acid, an alkoxycarbonyl group having a tertiary alkoxy group as the alkoxy group (and preferably having from 4 to 12 carbon atoms), an alkoxyalkyl group having a tertiary alkoxy group as the alkoxy group (and preferably having from 2 to 15 carbon atoms), an alkylsilyl group (preferably having from 1 to 20 carbon atoms), and a group constituting an acetal or ketal can be exemplified.

As the group constituting an acetal or ketal, for example, a group having any of the following structures can be exemplified.

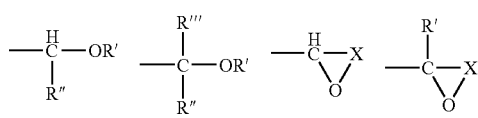

In the above formulae, R', R" and R'" each represents an alkyl group having 5 or less carbon atoms; and X represents a divalent alkylene group having 3 or more carbon atoms (preferably 20 or less carbon atoms), which may have a side chain.

As the specific examples of the groups capable of leaving by the action of an acid, an alkoxycarbonyl group, e.g., a t-butoxycarbonyl group, etc., an alkoxyalkyl group, e.g., a methoxymethyl group, an ethoxyethyl group, etc., an alkylsilyl group, e.g., a methylsilyl group, an ethylsilyl group, etc., a tetrahydropyranyl group, a tetrahydrofuranyl group, an alkoxy-substituted tetrahydropyranyl group, an alkoxy-substituted tetrahydrofuranyl group, etc., are exemplified as the representative examples, but the invention is not restricted thereto. As the group capable of leaving by the action of an acid, the most preferred groups are an ethoxyethyl group and a tetrahydropyranyl group.

As $R_3$ in the group represented by $—C(R_3)_2—COOR_4$, methyl, ethyl, n-propyl, and n-butyl are exemplified, and as the group capable of leaving by the action of an acid represented by $R_4$, a t-butyl group, a t-amyl group, a 1-methylcyclopentyl group, a 1-ethylcyclopentyl group, and a 1-ethylcyclohexyl group are exemplified.

As the specific examples of the tetravalent aromatic group, aliphatic group, heterocyclic group, or mixed group thereof represented by $X_3$, for example, the groups in the corresponding monomers of the later-described materials can be exemplified.

As the specific examples of the divalent aromatic group, heterocyclic group, alicyclic group, or aliphatic group represented by $X_2$, each of which groups may contain a silicon atom, and the divalent aromatic group, aliphatic group, heterocyclic group, or mixed group thereof represented by $Y_1$, for example, the groups in the corresponding monomers of the later-described materials can be exemplified.

As the method of introduction of the groups represented by Ra and Rb, etherification (Ra, Rb corresponding to an alkyl group), and esterification (Ra, Rb corresponding to an acyl group) by the reaction of a polymer having a hydroxyl group with alkyl halide or acyl halide under the basic condition, acetalization by the reaction of a polymer having a hydroxyl group with vinyl ethers under the acidic condition, alkoxycarbonylation by the reaction of a polymer having a hydroxyl group with alkyl carboxylate, silyl etherification by the reaction of a polymer having a hydroxyl group with a silyl chloride compound or acetoacetic esters under the basic condition, and acetoacetic esterification can be exemplified.

Further, esterification by the reaction of a polymer having a hydroxyl group with sulfonyl chloride or sulfonic anhydride under the basic condition can be exemplified.

In the introduction of the group represented by Ra and Rb into a polymer having a hydroxyl group, what is called is capping, the rate of capping is generally 40 mol % or less in all the hydroxyl groups, and preferably from 0.5 to 30 mol %. That the capping rate is 40 mol % or less is preferred in the point of prevention of the reduction of breaking elongation.

The intrinsic viscosity of PBO precursors at 25° C. in concentration of 0.5 g/dl measured in NMP is preferably from 0.1 to 0.7 dl/g, and more preferably from 0.12 to 0.6 dl/g.

PBO precursors have the degree of polymerization of generally from 5 to 1,000, and they can be synthesized by the reaction of the following monomers (A) and (B), i.e., (A1), (A2) and (B), in the presence of a base or a dehydration condensation agent.

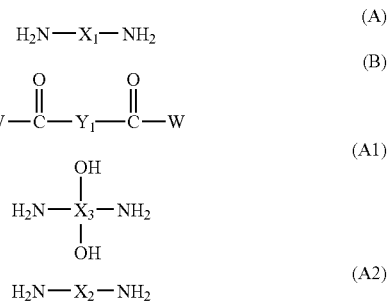

In the above formulae, $X_1$, $X_2$, $X_3$ and $Y_1$ are as already defined; W represents Cl, OR or OH, where R is an alkyl group having from 1 to 10 carbon atoms, preferably from 1 to 4 carbon atoms, a cycloalkyl group having from 3 to 10 carbon atoms, preferably from 3 to 6 carbon atoms, or an aryl group having from 6 to 10 carbon atoms. As the specific examples of these groups, e.g., methyl, ethyl, propyl, isopropyl, butyl, isobutyl, t-butyl, cyclohexyl, phenyl, p-tolyl and the like are exemplified.

The ratio of (A) to (B) is generally (A)/(B)>1, and preferably $1.2 \geq (A)/(B) > 1$. By making (A)/(B)>1, it becomes possible to synthesize a polybenzoxazole precursor having an amino group at the terminal. Monomer (A1) is about 50 to 100 mol % of (A), i.e., [(A1)+(A2)], and monomer (A2) is about 0 to 50 mol % of (A), i.e., [(A1)+(A2)].

In monomer (A1), $X_3$ represents a tetravalent aromatic group, aliphatic group or heterocyclic group, e.g., the following groups are specifically exemplified.

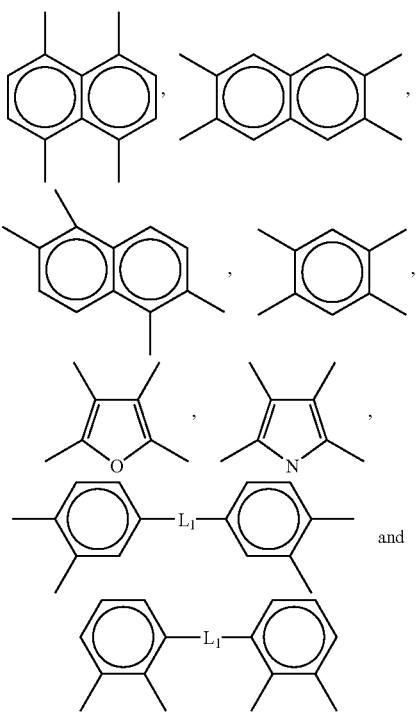

In the above formula, $L_1$ represents —O—, —S—, —C(CF$_3$)$_2$—, —C(CH$_3$)$_2$—, —CH$_2$—, —SO$_2$—, —NHCO—, —COO—, or the following group.

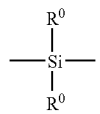

In the above formula, $R^0$ each represents an alkyl group having from 1 to 10 carbon atoms, preferably from 1 to 4 carbon atoms, or a cycloalkyl group having from 3 to 10 carbon atoms, preferably from 3 to 6 carbon atoms (e.g., —CH$_3$, —C$_2$H$_5$, n-C$_3$H$_7$, i-C$_3$H$_7$, n-C$_4$H$_9$, t-C$_4$H$_9$, and a cyclohexyl group).

$X_3$ is not restricted to these groups. Further, mixtures of two or more monomers may be used as monomer (A).

In monomer (A2), $X_2$ represents a divalent aromatic group, heterocyclic group, alicyclic group, or aliphatic group, which may or may not contain silicon. When $X_2$ contains silicon, it is preferred to contain a divalent siloxane structure.

The examples of monomers (A2) containing $X_2$ include, e.g., 5(6)-diamino-1-(4-aminophenyl)-1,3,3-trimethylindane (DAPI), m-phenylenediamine, p-phenylenediamine, 2,2'-bis (trifluoro-methyl)-4,4'-diamino-1,1'-biphenyl, 3,4'-diamino-diphenyl ether, 4,4'-diaminodiphenyl ether, 3,3'-diamino-diphenyl ether, 2,4-tolylenediamine, 3,3'-diaminodiphenylsulfone, 3,4'-diaminodiphenylsulfone, 4,4'-diaminodiphenylsulfone, 3,3'-diaminodiphenylmethane, 4,4'-diaminodiphenylmethane, 3,4'-diaminodiphenyl-methane, 4,4'-diaminodiphenyl ketone, 3,3'-diaminodiphenyl ketone, 3,4'-diaminodiphenyl ketone, 1,3-bis(4-aminophenoxy)benzene, 1,3-bis(3-aminophenoxy)-benzene, 1,4-bis(γ-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethyl-hexamethylenediamine, 3-methoxyhexamethylenediamine, heptamethylenediamine, 2,5-dimethylheptamethylenediamine, 3-methylheptamethylenediamine, 4,4-dimethylheptamethylene-diamine, octamethylenediamine, nonamethylenediamine, 2,5-dimethylnonamethylenediamine, docamethylenediamine, ethylenediamine, propylenediamine, 2,2-dimethylpropylene-diamine, 1,10-diamino-1,10-dimethyldecane, 2,11-diamino-dodecane, 1,12-diaminooctadecane, 2,17-diaminoeicosane, 3,3'-dimethyl-4,4'-diaminodiphenylmethane, bis(4-amino-cyclohexyl) methane, 3,3'-diaminodiphenylethane, 4,4'-diaminodiphenylethane, 4,4'-diaminodiphenyl sulfide, 2,6-diaminopyridine, 2,5-diaminopyridine, 2,6-diamino-4-trifluoromethylpyridine, 2,5-diamino-1,3,4-oxadiazole, 1,4-diaminocyclohexane, piperazine, 4,4'-methylenedianiline, 4,4'-methylenedi-bis(o-chloroaniline), 4,4'-methylene-bis-(3-methylaniline), 4,4'-methylene-bis(2-ethylaniline), 4,4'-methylene-bis(2-methoxyaniline), 4,4'-oxy-dianiline, 4,4'-oxy-bis(2-methoxyaniline), 4,4'-oxy-bis(2-chloro-aniline), 4,4'-thio-dianiline, 4,4'-thio-bis(2-methyl-aniline), 4,4'-thio-bis(2-methoxyaniline), 4,4'-thio-bis-(2-chloroaniline), 3,3'-sulfonyl-dianiline, and mixtures of these compounds, but the invention is by no means restricted thereto.

In monomer (B), $Y_1$ represents a divalent aromatic group, aliphatic group or heterocyclic group, and, the following groups are specifically exemplified.

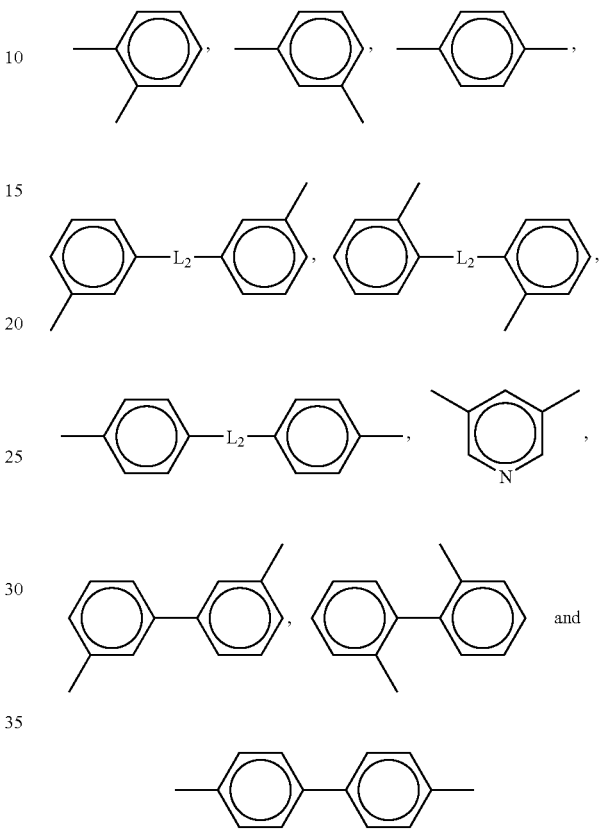

In the above formulae, $L_2$ represents —O—, —S—, —C(CF$_3$)$_2$—, —CH$_2$—, —SO$_2$—, —NHCO— or —COO—.

$Y_1$ is not restricted to these groups. Further, mixtures of two or more monomers may be used as monomer (B).

The examples of preferred reaction solvents for polymerizing monomers include N-methyl-2-pyrrolidone (NMP), γ-butyrolactone (GBL), N,N-dimethylformamide (DMF), N,N-dimethylacetamide (DMAc), dimethyl-2-piperidone, dimethyl sulfoxide (DMSO), sulforan, and diglyme. The most preferred solvents are N-methyl-2-pyrrolidone (NMP) and γ-butyrolactone (GBL). For reacting a dicarboxylic acid or the chloride or ester thereof with at least one aromatic and/or heterocyclic dihydroxydiamine, and in some case for reacting with at least one diamine, conventionally used reaction may be arbitrarily used. The reaction is generally carried out at about −30 to about 30° C. for 6 to 48 hours or so.

The thus-obtained polybenzoxazole precursor having an amino group at the terminal is chemically converted to a polybenzoxazole precursor of the invention in the following manner.

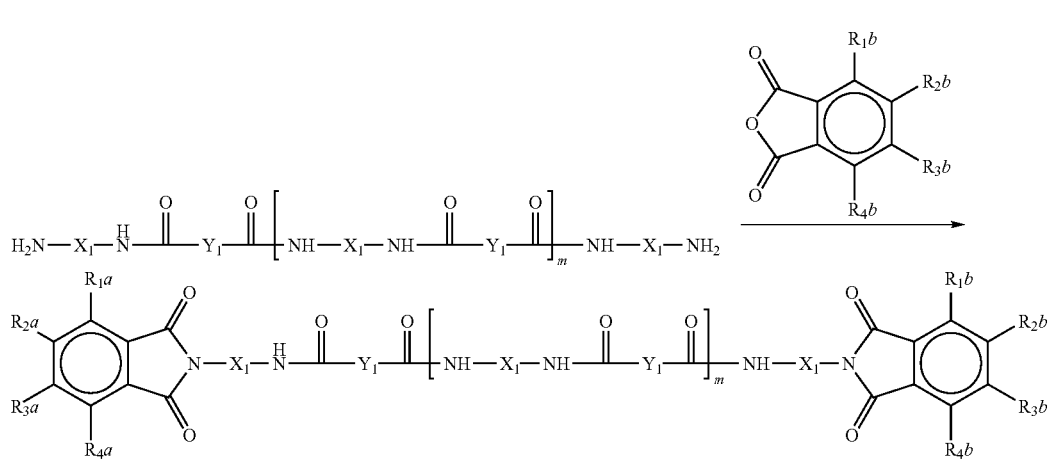

(1)

As the reaction method, various known methods can be used, e.g., heating at 40 to 100° C. or so and using a dehydrating agent, using a dehydrating agent and a basic catalyst, and using a basic catalyst. As the dehydrating agent used at this time, conventionally known dehydrating agents can be used, e.g., acetic anhydride, propionic anhydride, benzoic anhydride, trifluoroacetic anhydride, acetyl chloride, tosyl chloride, mesyl chloride, ethyl chloroformate, triphenylphosphine and dibenzimidazolyl disulfide, dicyclohexyl carbodiimide, N,N'-carbonyldiimidazole, 2-ethoxy-1-ethoxycarbonyl-1,2-dihydroquinoline, and N,N'-disuccinimidyl oxalate are exemplified, when a basic catalyst is used, pyridine, picoline, 2,6-lutidine, collidine, triethylamine, N-methylmorpholine, 4-N,N'-dimethylaminopyridine, isoquinoline, triethylamine, 1,4-diazabicyclo [2.2.2]octane, and 1,8-diazabicyclo [5.4.0]-7-undecene are exemplified, but basic catalysts are not restricted to these compounds. Further, by the selection of an imidation method, hydroxypolyamide of the invention can be obtained by the addition of an acid anhydride for terminal condensation and an imidating agent at the same time to a polymer having amino groups at both terminals without going through an intermediate. As another method for obtaining hydroxypolyamide of the invention, an amino group of bis-(O-aminophenols) alone is reacted with an acid anhydride and then imidated, and the resulting compound may be added at the time of polycondensation of an aromatic dicarboxylic acid or a derivative thereof and bis-(O-aminophenols).

As organic solvents for use in the above reaction, polar solvents capable of completely dissolving hydroxypolyamide formed are generally preferably used, and, e.g., N-methyl-2-pyrrolidone, N,N-dimethylacetamide, N,N-dimethylformamide, dimethyl sulfoxide, tetramethylurea and γ-butyrolactone are exemplified. In addition, besides these polar solvents, general organic solvents of ketones, esters, lactones, ethers, halogenated hydrocarbons, and as hydrocarbons, e.g., acetone, methyl ethyl ketone, methyl isobutyl ketone, cyclohexanone, methyl acetate, ethyl acetate, butyl acetate, diethyl oxalate, ethylene glycol dimethyl ether, diethylene glycol dimethyl ether, tetrahydrofuran, dichloromethane, 1,2-dichloroethane, 1,4-dichlorobutane, chlorobenzene, o-dichlorobenzene, hexane, heptane, benzene, toluene, xylene, etc., can also be used. The reaction product can be offered to a resist composition as it is, but, according to necessity, a refined product can also be used by pouring the reaction product into water or a bad solvent of hydroxypolyamide, e.g., methanol, etc., and further repeating reprecipitation.

The addition amount of PBO precursor is from 50 to 99.5 mass % based on all the solids content of the photosensitive resin composition of the invention (the total amount of the components constituting the finally obtained hardened product exclusive of solvents), and preferably from 60 to 97 mass %.

As preferred PBO precursor, a PBO precursor represented by formula (1) wherein at least one of $X_1$ and $Y_1$ has a structure represented by formula (A2-2) is preferred for the reduction of a thermal expansion coefficient.

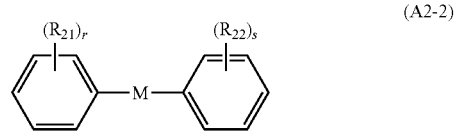

(A2-2)

In formula (A2-2), M represents a single bond or a divalent group; $R_{21}$, and $R_{22}$ each represents a fluorine atom or a univalent organic group; and r and s each represents an integer of from 1 to 4. —NH— and —CO— in formula (1) are bonded onto the benzene ring in formula (A2-2).

The structure represented by formula (A2-2) is preferably a structure represented by the following formula (A2-3).

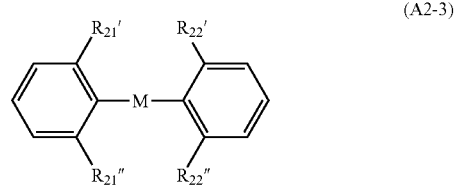

(A2-3)

In formula (A2-3), $R_{21}'$, $R_{21}''$, $R_{22}'$ and $R_{22}''$ each represents a hydrogen atom, a fluorine atom or a univalent organic group (e.g., an alkyl group, an alkoxy group, a fluoroalkyl group, a fluoroalkoxy group, etc., each having from 1 to 10 carbon atoms), and at least one of $R_{21}'$ and $R_{21}''$ and at least one of $R_{22}'$ and $R_{22}''$ preferably represent a fluorine atom or a univalent organic group, and more preferably at least one of $R_{21}'$ and $R_{21}''$ and at least one of $R_{22}'$ and $R_{22}''$ represent a univalent organic group. —NH— and —CO— in formula (1) are bonded onto the benzene ring in formula (A2-2).

It is most preferred for M to represent a single bond for capable of giving a polymer of low stress and high transparency, and $R_{21}'$, $R_{21}''$, $R_{22}'$ and $R_{22}''$ each preferably represents a methyl group, a trifluoromethyl group, an ethyl group, an isopropyl group or a t-butyl group.

As diamine components capable of giving the structure represented by formula (A2-2) (including the structure represented by formula (A2-3)), 2,2'-bis(trifluoromethyl)-bis(3-hydroxy-4-amino)biphenyl, 2,2'-dimethyl-bis(3-hydroxy-4-amino)biphenyl, and bis(3-amino-4-hydroxy-6-methylphenyl)sulfone are exemplified. As the similar dicarboxylic acids, 2,2'-dimethyl-4,4'-biphenylcarboxylic acid, 2,2'-bis(trifluoromethyl)-4,4'-biphenylcarboxylic acid, 4,4'-dicarboxy-2,2'-dimethyl diphenyl ether are exemplified.

A repeating unit containing the partial structure represented by formula (A2-2) preferably accounts from 20 to 70 mol % of all the repeating units, and more preferably from 20 to 60 mol %. From the improving effect of a thermal expansion coefficient, 20 mol % or more is preferred, and for avoiding the reduction of breaking elongation, 70 mol % or less is preferred.

The molecular weight of the PBO precursor is not especially restricted, and from 2,000 to 100,000 as number average molecular weight is preferred. Number average molecular weight can be measured by gel permeation chromatography and computed as standard polystyrene equivalent.

[2] Photosensitizer:

Photosensitizers are not especially restricted, and, for example, known quinonediazide photosensitizers, diaryl-sulfonium salt, triarylsulfonium salt, dialkylphenacyl-sulfonium salt, diaryliodonium salt, aryldiazonium salt, aromatic tetracarboxylic ester, aromatic sulfonic ester, nitrobenzyl ester, aromatic N-oxyimidosulfonate, aromatic sulfamide, oxime sulfonate and the like are used. o-quinonediazide photosensitizers and oxime sulfonate can be especially preferably used.

Oxime sulfonate represented by the following formula is preferably used.

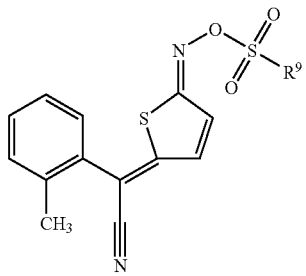

In the above formula, $R^9$ represents an alkyl group having from 1 to 8 carbon atoms, a cycloalkyl group having from 5 to 8 carbon atoms, an aryl group having from 6 to 14 carbon atoms, or a camphor residue. As the examples of the alkyl groups and cycloalkyl groups, e.g., methyl, ethyl, propyl, isopropyl, butyl, cyclopentyl, and cyclohexyl, and as the aryl grops, a phenyl group, a tolyl group, a xylyl group and a mesityl group can be exemplified.

o-Quinonediazide photosensitizers can be obtained, e.g., by the condensation reaction of o-quinonediazide sulfonyl chlorides with a hydroxyl compound or an amino compound in the presence of a dehydrochlorinating agent.

As the o-quinonediazide sulfonyl chlorides, e.g., benzoquinone-1,2-diazide-4-sulfonyl chloride, naphthoquinone-1,2-diazide-5-sulfonyl chloride, and naphthoquinone-1,2-diazide-4-sulfonyl chloride can be used, and it is preferred to use naphthoquinone-1,2-diazide-4-sulfonyl chloride in view of sensitivity.

As the hydroxyl compounds, e.g., hydroquinone, resorcinol, pyrogallol, bisphenol A, bis(4-hydroxyphenyl)-methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-penta-hydroxybenzophenone, 2,3,4,3',4',5'-hexahydroxybenzophenone, bis(2,3,4-trihydroxyphenyl)methane, bis(2,3,4-trihydroxy-phenyl)propane, 4b,5,9b,10-tetrahydro-1,3,6,8-tetrahydroxy-5,10-dimethylindeno [2,1-a]indene, tris(4-hydroxyphenyl)-methane, tris(4-hydroxyphenyl)ethane and the like can be used.

As the amino compounds, e.g., p-phenylenediamine, m-phenylenediamine, 4,4'-diaminodiphenyl ether, 4,4'-diaminodiphenylmethane, 4,4'-diaminodiphenyl sulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxy-phenyl)sulfone, bis(3-amino-4-hydroxyphenyl) hexafluoro-propane, bis(4-amino-3-hydroxyphenyl) hexafluoropropane and the like can be used.

It is preferred that the o-quinonediazide sulfonyl chloride and the hydroxyl compound and/or amino compound are blended so that the sum total of the hydroxyl group and the amino group is from 0.5 to 1 equivalent to 1 mol of the o-quinonediazide sulfonyl chloride. The preferred range of proportion of the dehydrochlorinating agent and the o-quinonediazide sulfonyl chloride is from 1/1 to 1/0.9. The preferred reaction temperature is from 0 to 40° C., and the preferred reaction time is from 1 to 24 hours.

As the reaction solvents, solvents such as dioxane, 1,3-dioxolan, acetone, methyl ethyl ketone, tetrahydrofuran, chloroform, N-methylpyrrolidone, etc., are used. As the dehydrochlorinating agent, sodium carbonate, sodium hydroxide, sodium hydrogencarbonate, potassium carbonate, potassium hydroxide, trimethylamine, triethylamine, pyridine, and 4-dimethylaminopyridine are exemplified.

In the positive photosensitive resin composition in the invention, the blending amount of the quinonediazide photosensitizer is, from the points of the difference in dissolution rate between an unexposed area and an exposed area, and the tolerance of sensitivity, preferably from 5 to 50 mass parts per 100 mass parts of the PBO precursor, and more preferably from 8 to 20 mass parts.

The blending amount of photosensitizers other than the quinonediazide photosensitizer is preferably from 0.1 to 15 mass parts per 100 mass parts of the PBO precursor, and more preferably from 0.5 to 10 mass parts.

As the quinonediazide photosensitizers e.g., compounds having any of the following structures can be exemplified.
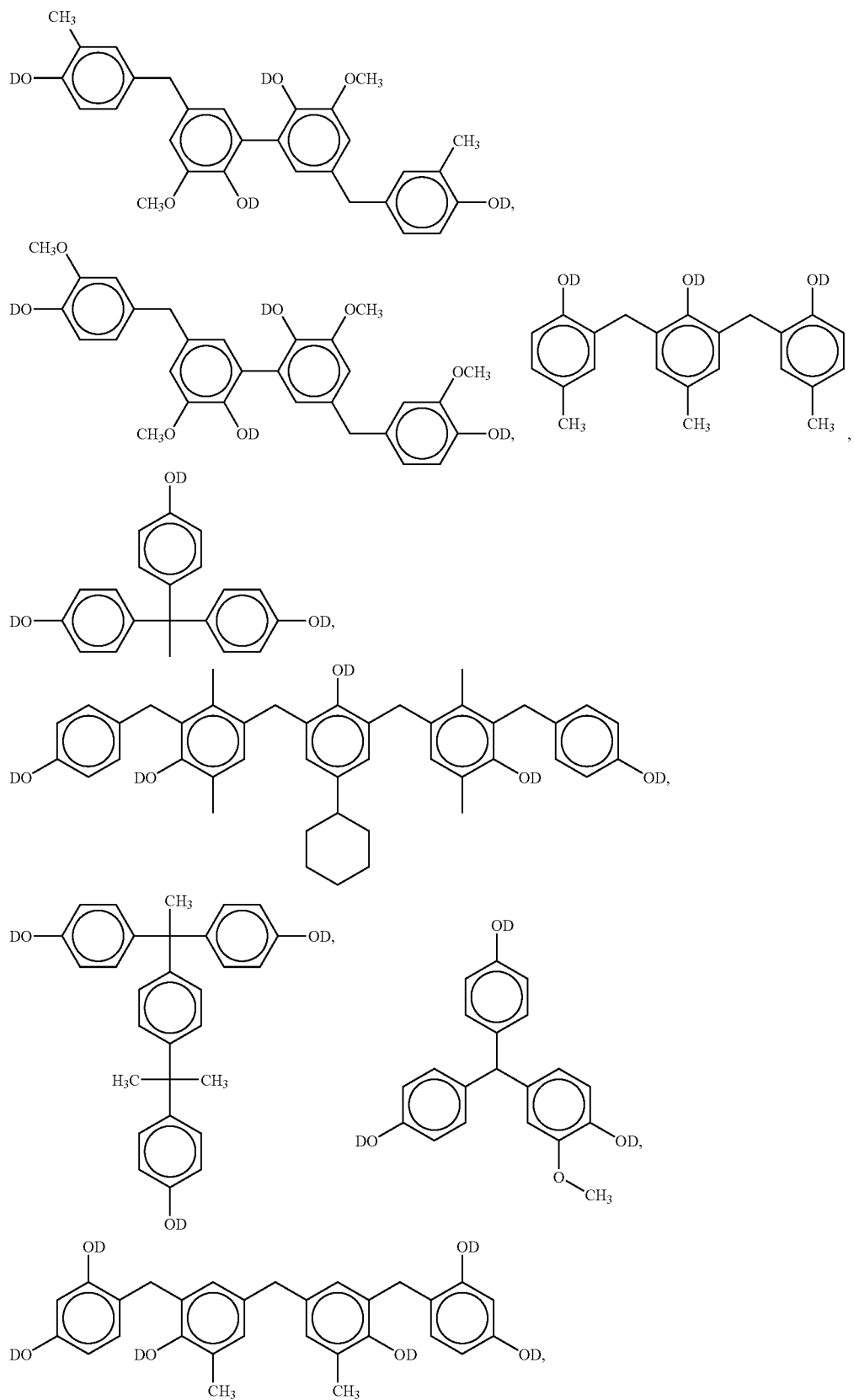

-continued
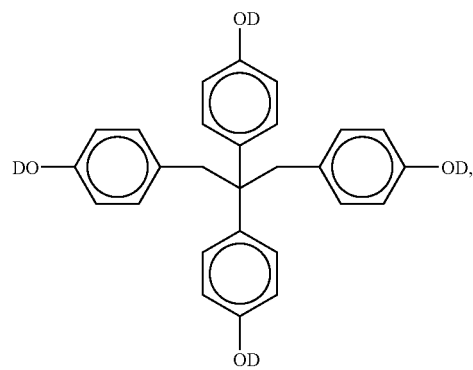
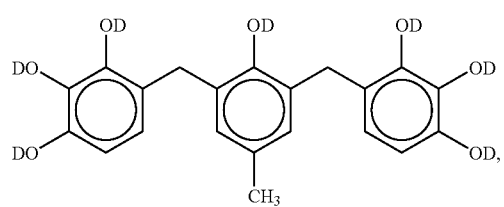
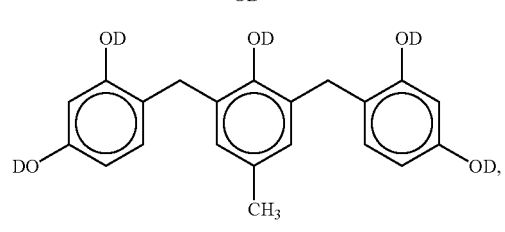
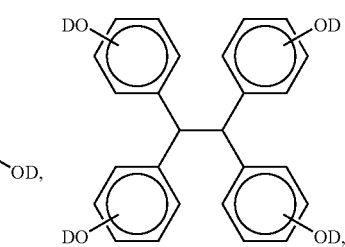
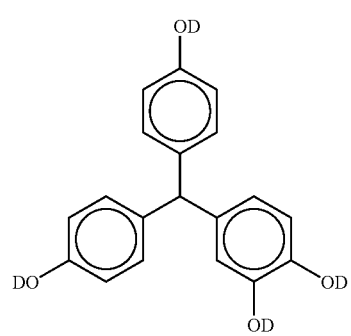
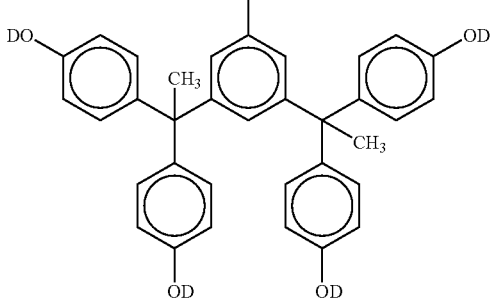
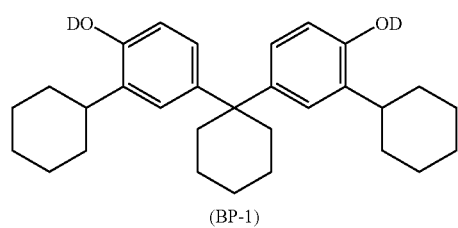
(BP-1)
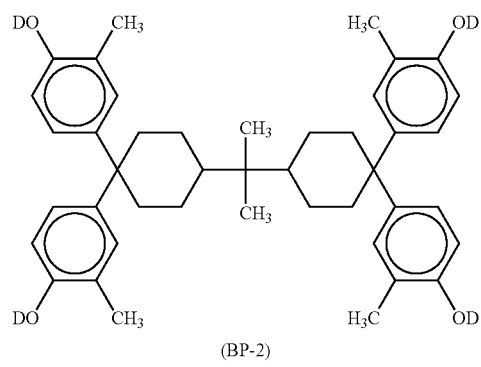
(BP-2)

In the formulae, D represents H or any of the following groups.

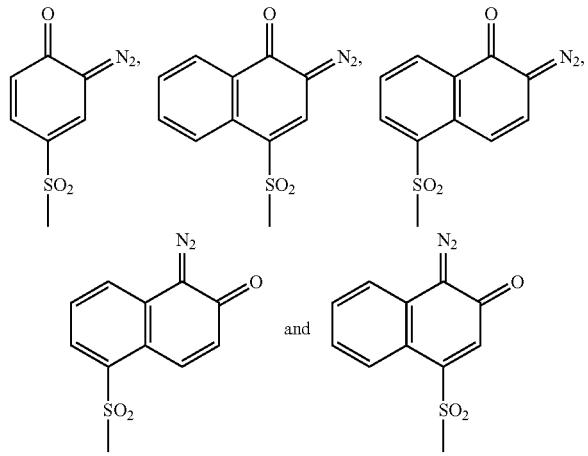

However, it is sufficient that at least one of D's is the quinonediazide group in each compound.

Commercially available quinonediazide photosensitizers may be used, or quinonediazide photosensitizers may be synthesized according to known methods.

[3] Phenol Compound:

A low molecular weight phenol compound can be added to the positive photosensitive resin composition of the invention. The addition techniques of a phenol compound to the positive resist composition are disclosed, e.g., in JP-A-3-200251, JP-A-3-200252, JP-A-3-200253, JP-A-3-200254, JP-A-4-1650, JP-A-4-11260, JP-A-4-12356 and JP-A-4-12357.

As a preferred example of a low molecular weight phenol compound, at least one phenol compound selected from the group consisting of a phenol compound having a structure represented by formula (3-1) and a phenol compound having a structure represented by formula (3-2) can be exemplified.

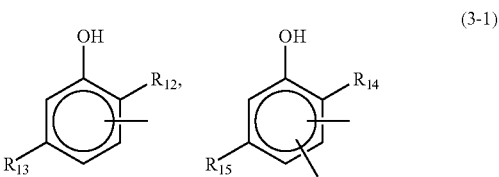

(3-1)

In formula (3-1), $R_{12}$ to $R_{15}$ each represents an alkyl group, an alkoxy group or a cycloalkyl group.

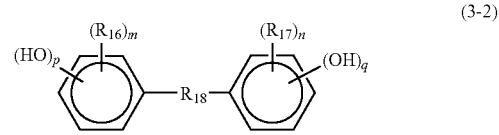

(3-2)

In formula (3-2), $R_{16}$ and $R_{17}$ each represents a halogen atom, an alkyl group, an alkoxy group, an alkyl ester group, a cycloalkyl group or a cycloalkoxy group, and m and n each represents an integer of from 0 to 5. When two or more $R_{16}$ and $R_{17}$ are present, they may be the same or different. p and q each represents an integer of from 0 to 3, and $p+q \geq 2$.

$R_{18}$ represents a single bond, a methylene group, an alkylene group, an oxygen atom, a carbonyl group, a carbonyl ether group, a sulfur atom, a sulfonyl group or an azo group.

When these phenol compounds are used in the positive photosensitive resin composition of the invention comprising a polybenzoxazole precursor as the base resin, high improving effect of sensitivity can be ensured.

As the phenol compound having a structure represented by formula (3-1), the following compounds are exemplified, but the invention is not restricted to these compounds. These compounds may be used in combination of two or more.

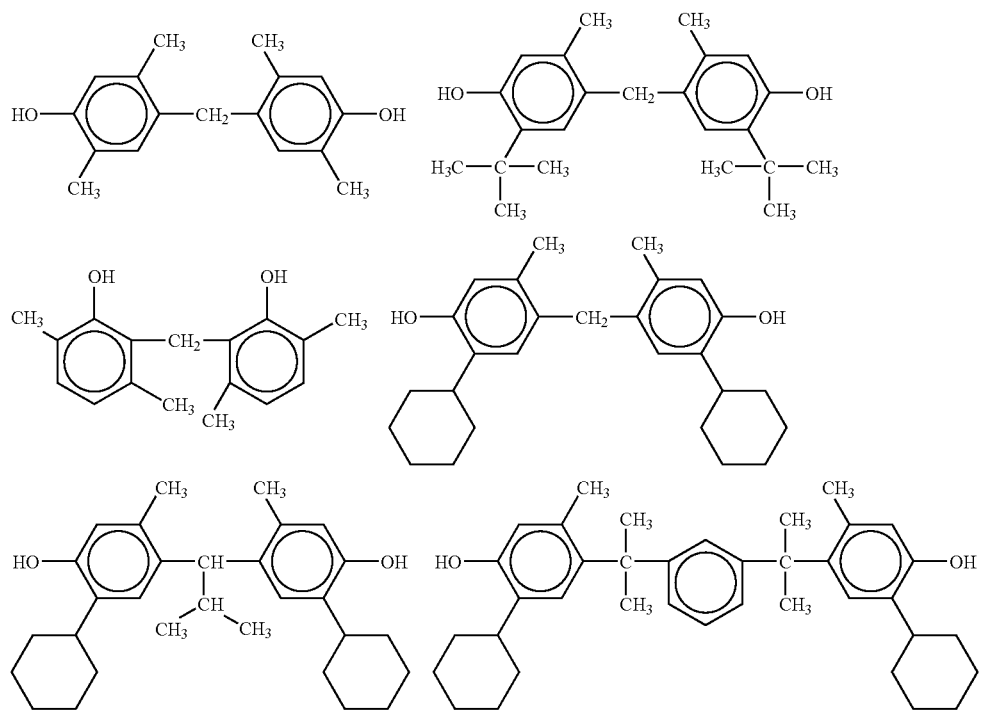

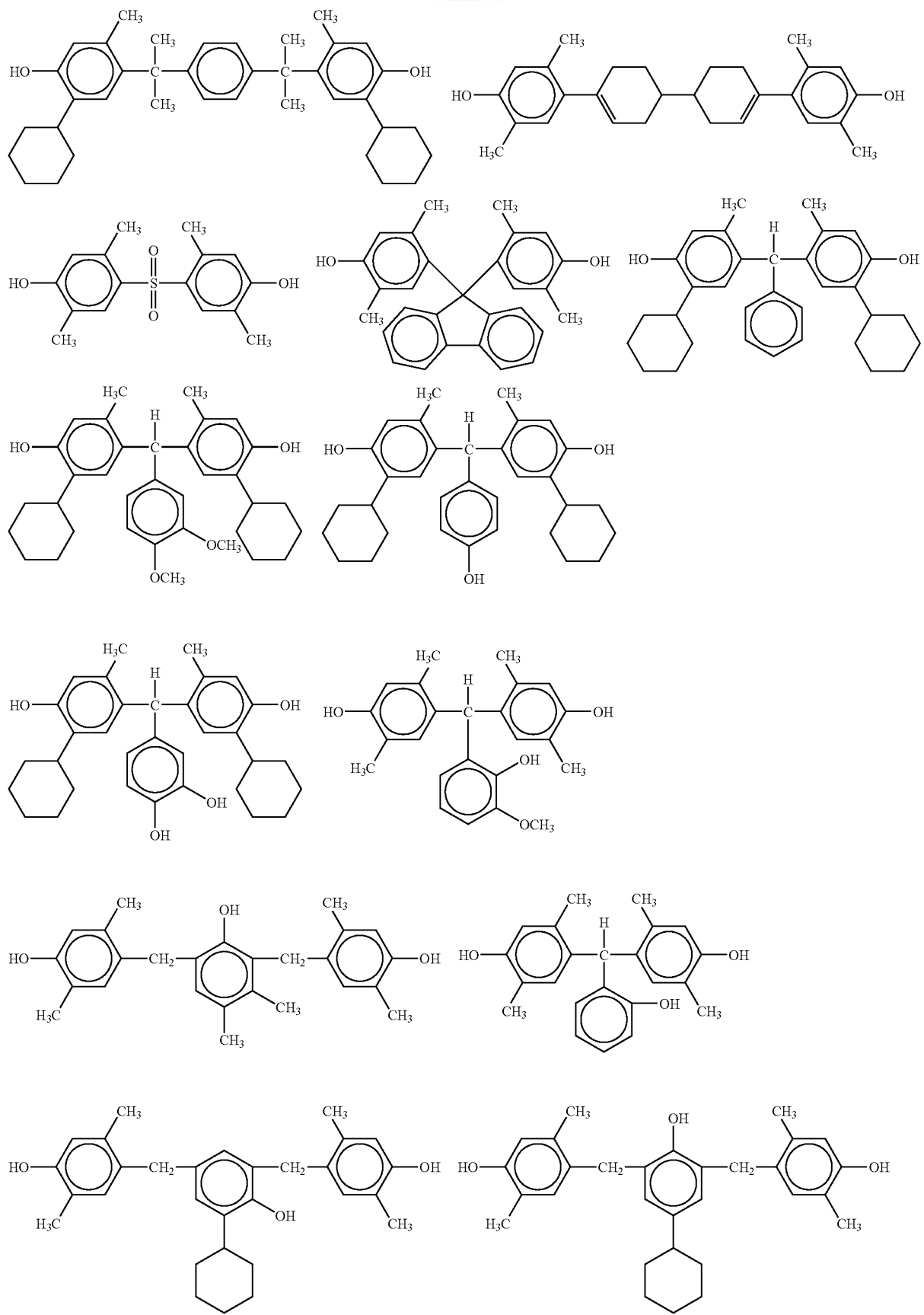

-continued
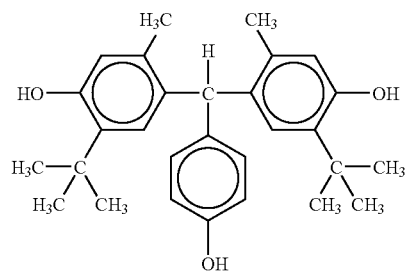
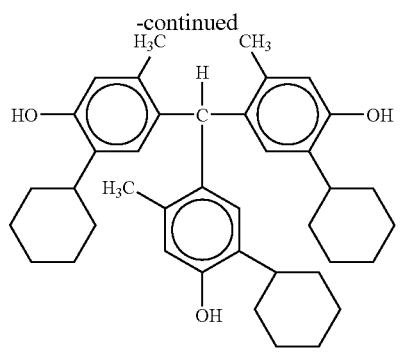
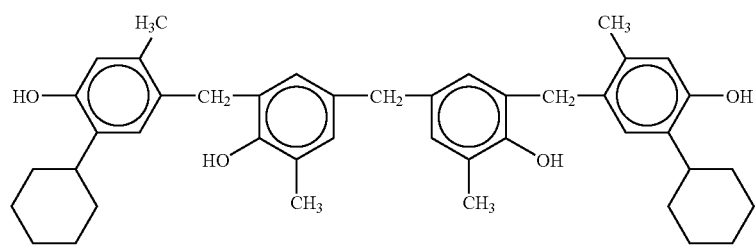
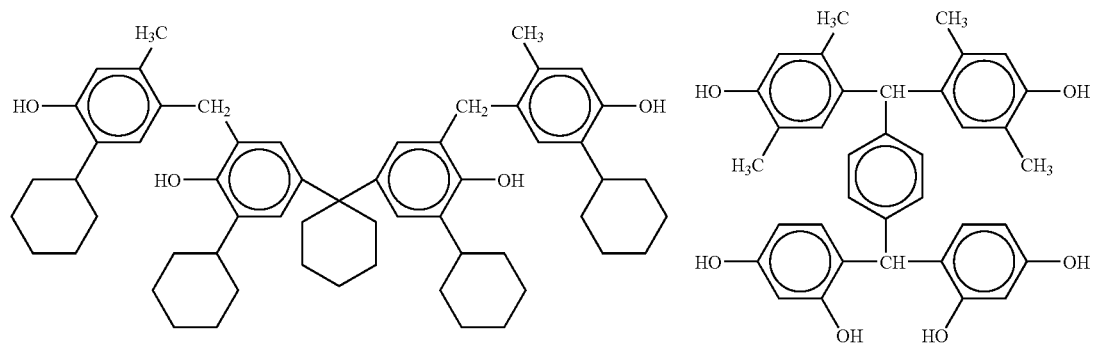
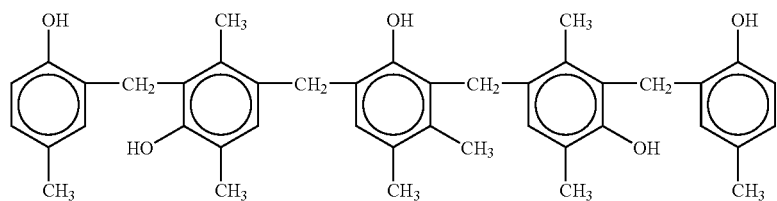
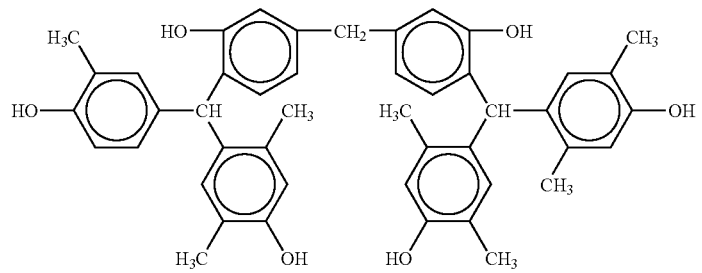

-continued
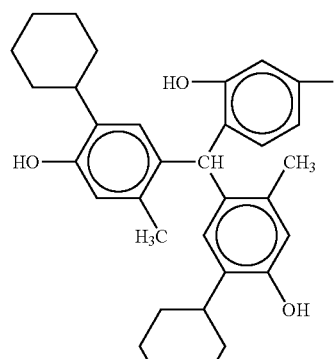
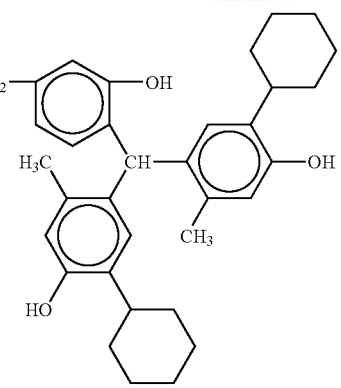
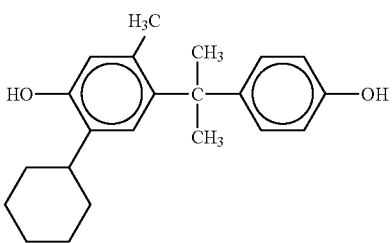
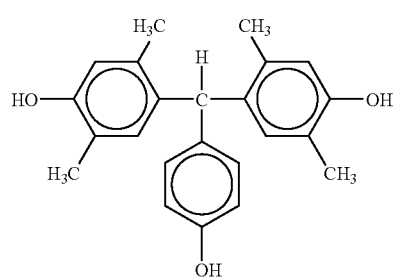
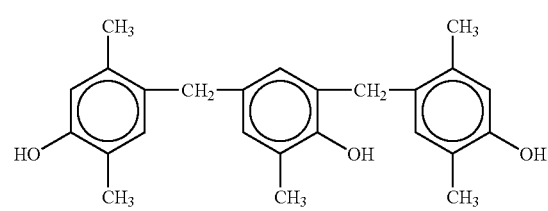
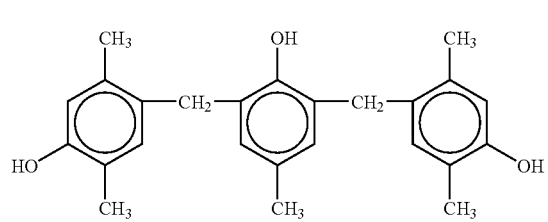
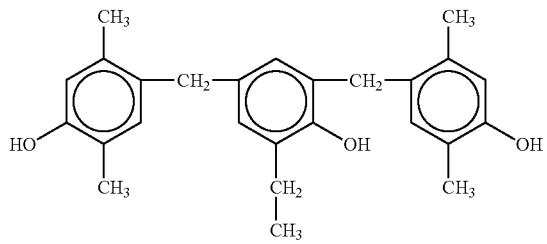
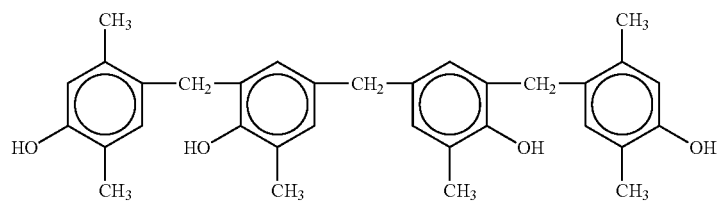
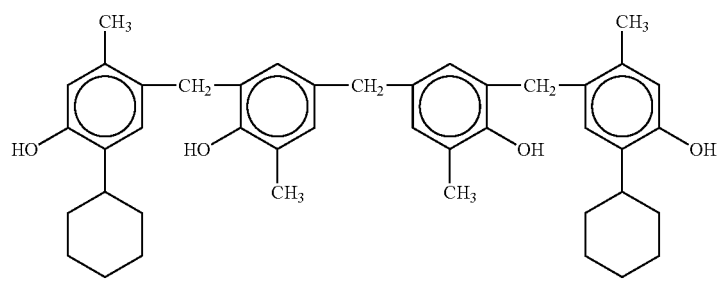
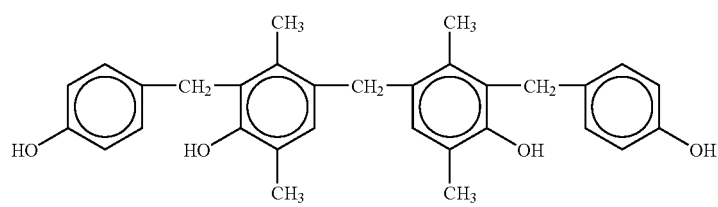

-continued
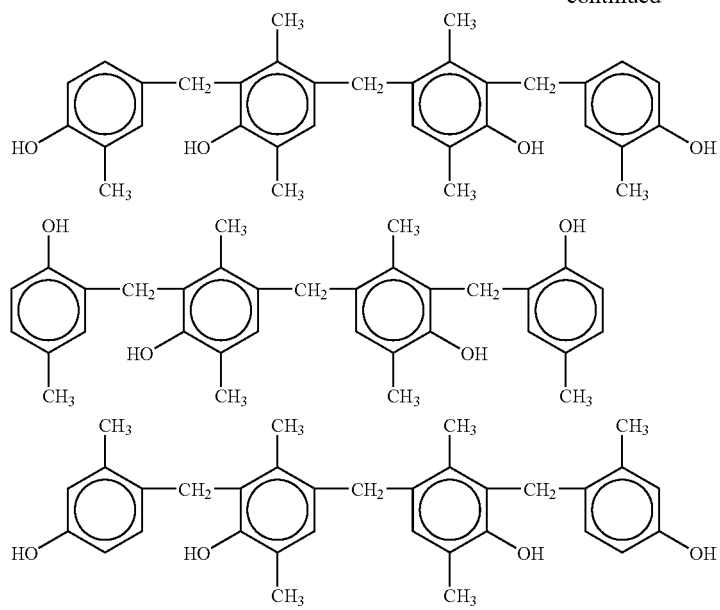
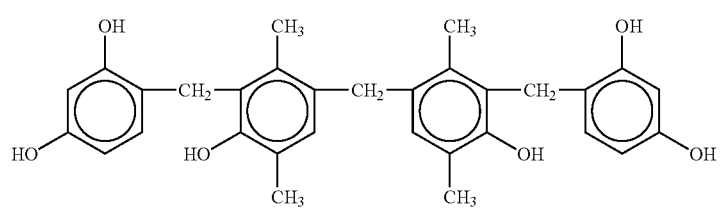
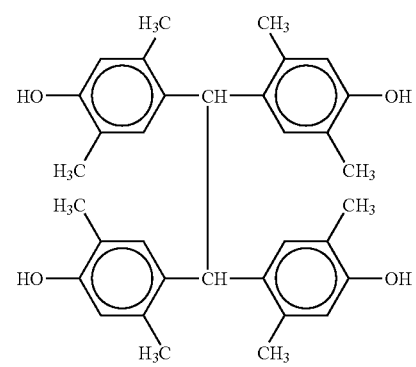
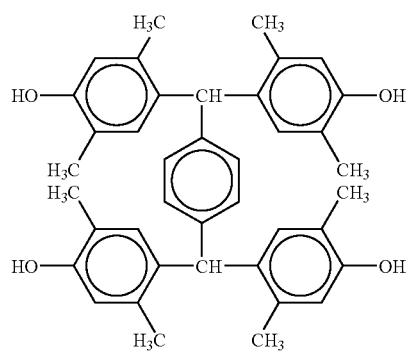
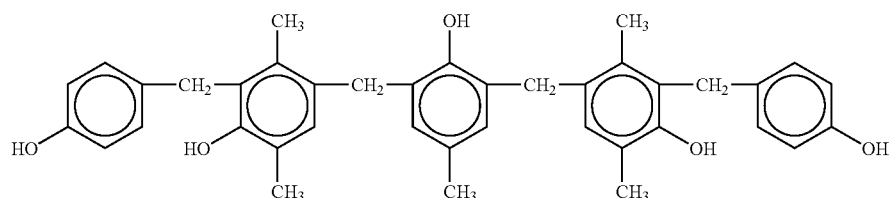
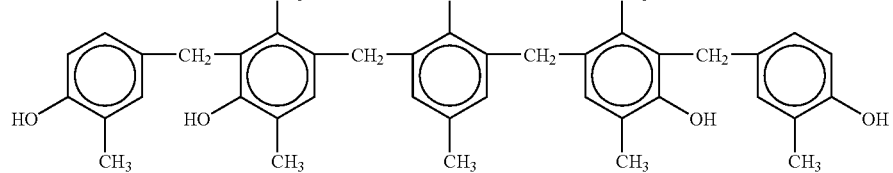

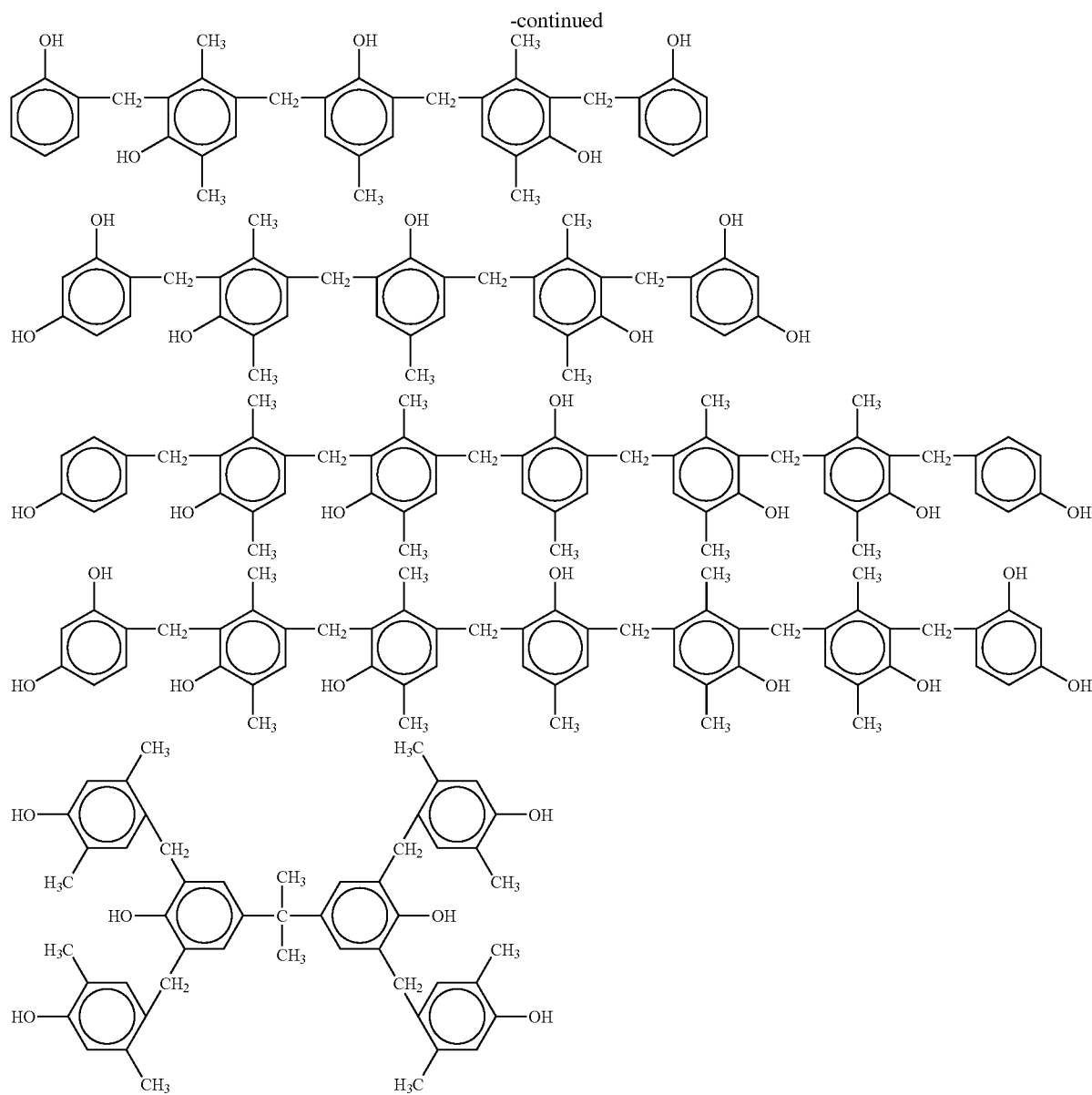
As the phenol compound having a structure represented by formula (3-2), the following compounds are exemplified, but the invention is not restricted to these compounds. These compounds may be used in combination of two or more.
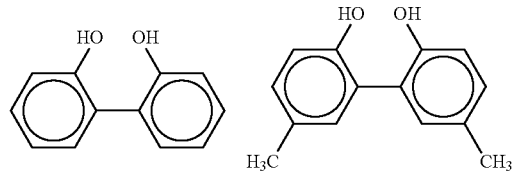
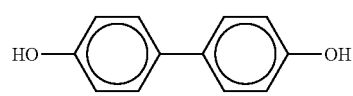
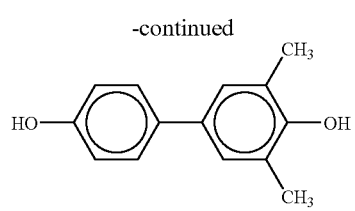
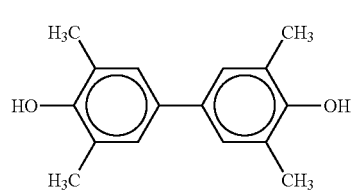

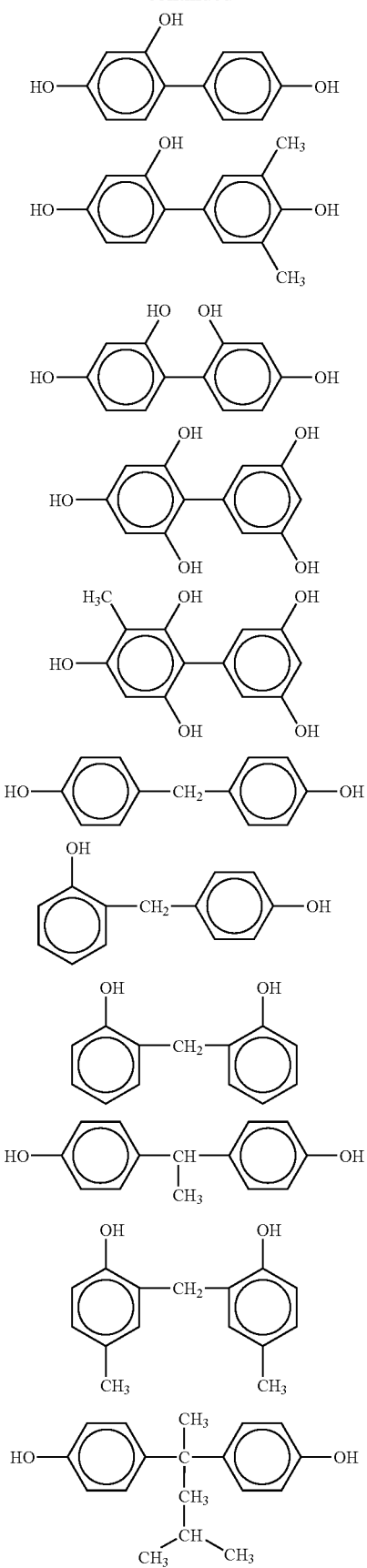
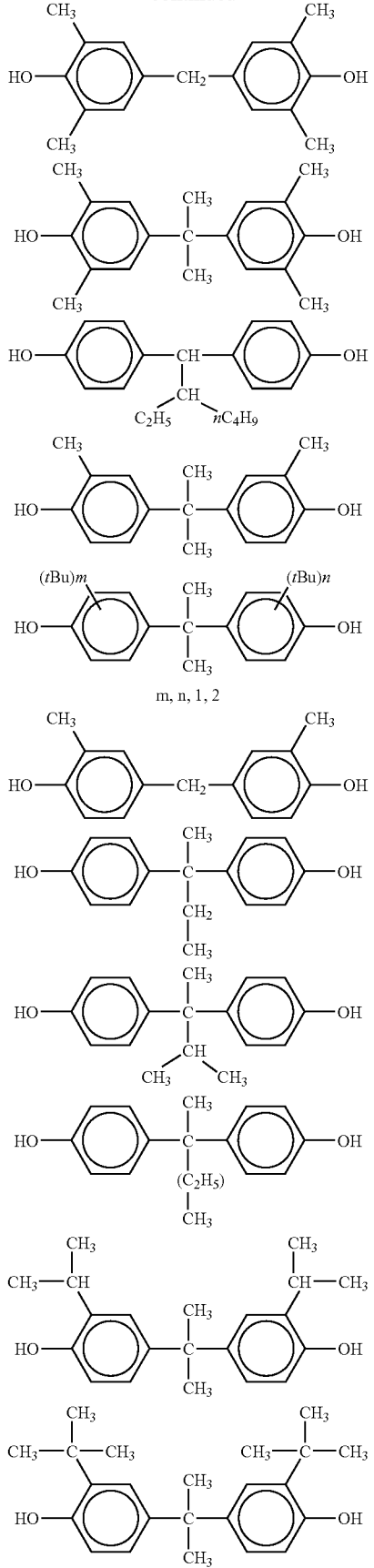

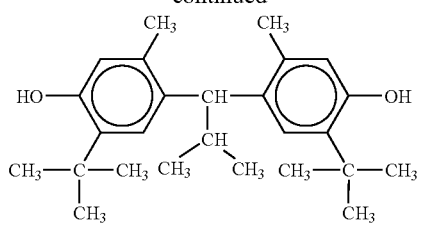
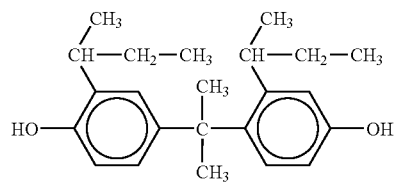
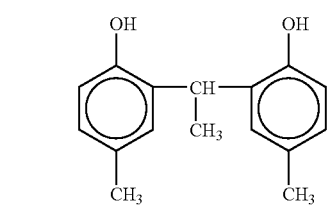
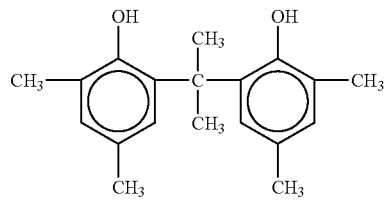
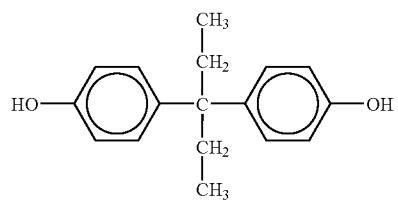
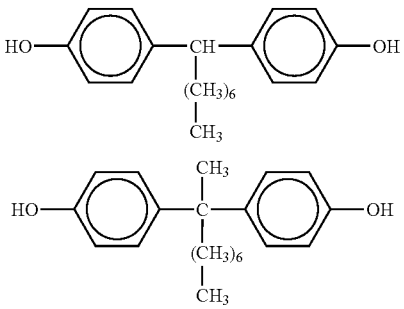
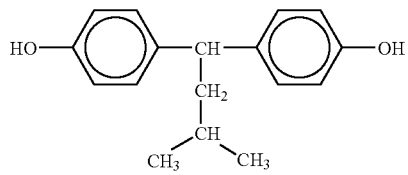
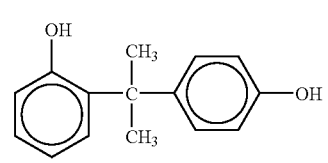
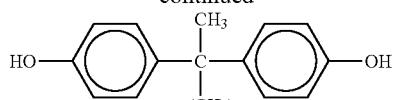
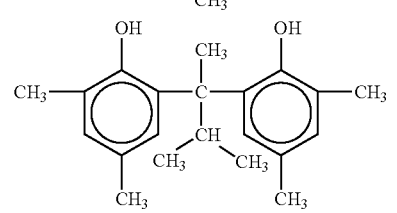
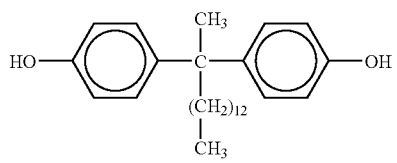
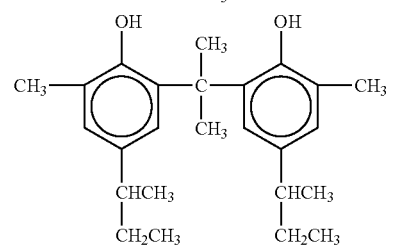
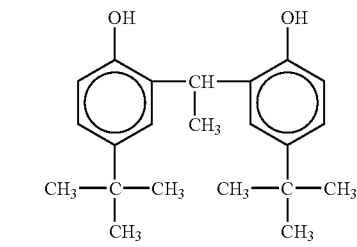
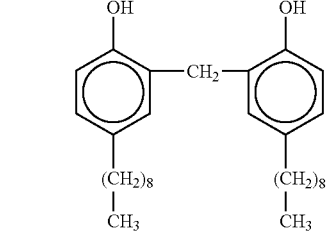
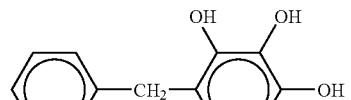
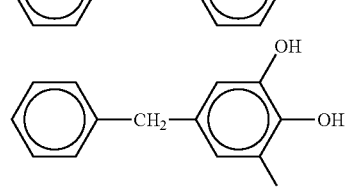
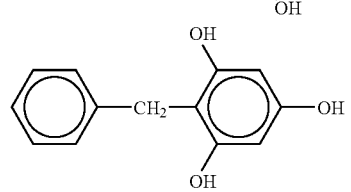

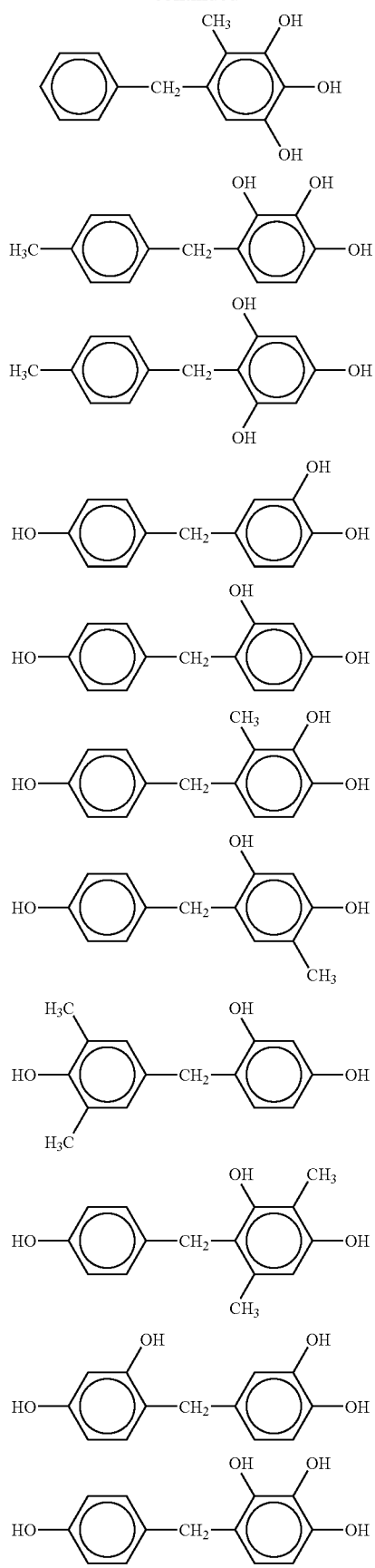
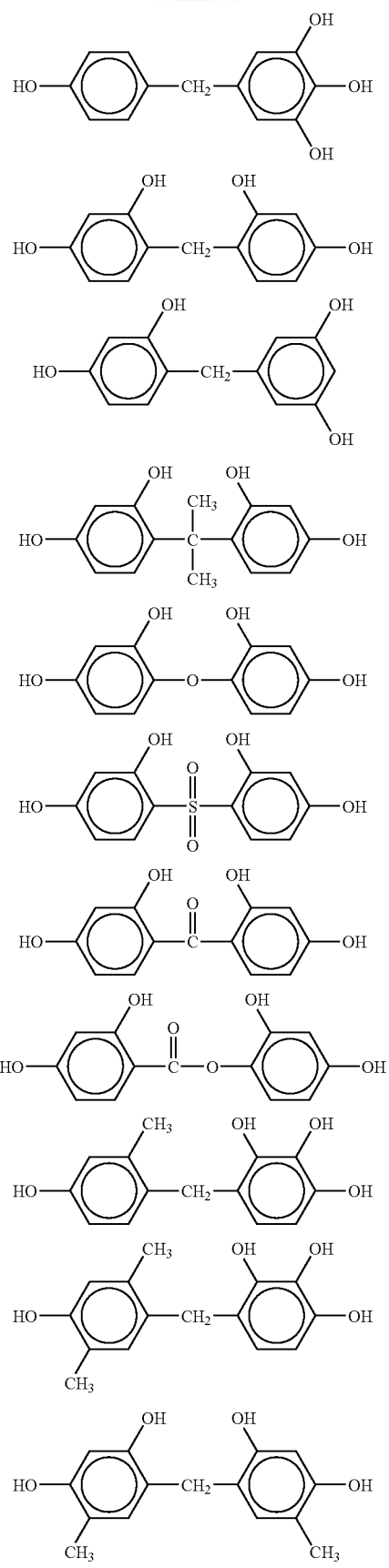

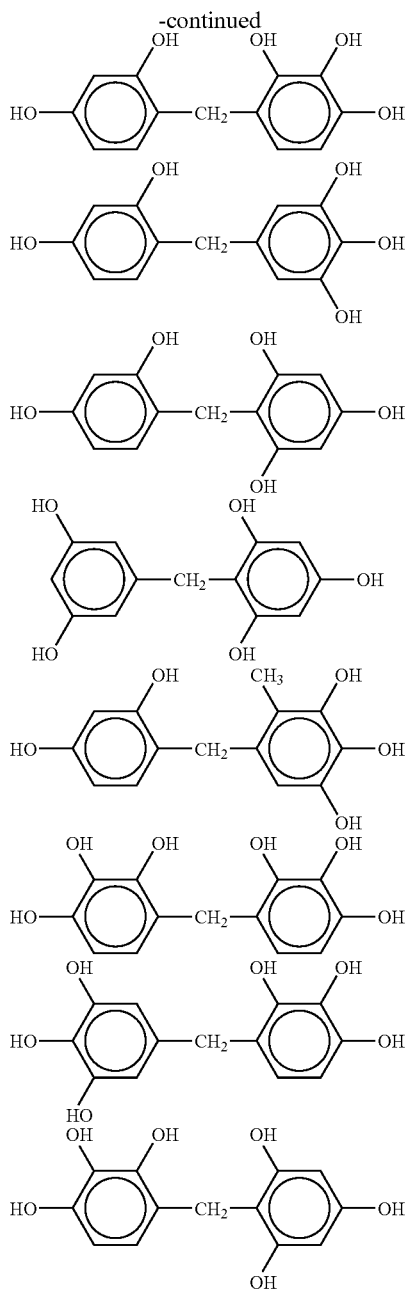

Besides the phenol compounds having a structure represented by formula (3-1) and the phenol compounds having a structure represented by formula (3-2), if necessary, the following compounds can also be used in the invention, but not restricted thereto.

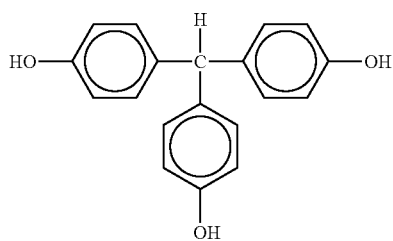

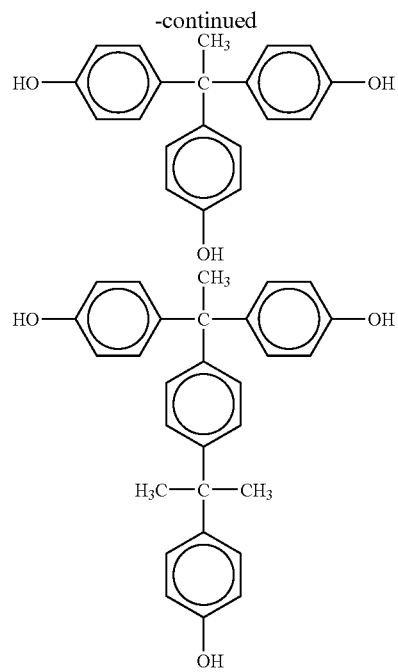

The preferred addition amount of the phenol compound having a structure represented by formula (3-1) and the phenol compound having a structure represented by formula (3-2) is from 1 to 30 mass parts per 100 mass parts of the PBO precursor. From the point of sensitivity, the addition amount is preferably 1 mass part or more, and from the aspects of prevention of conspicuous film reduction of unexposed area at development time and restraint of precipitation during freezing preservation, the addition amount is preferably 30 mass parts or less.

[4] Solvent:

The photosensitive resin composition of the invention is generally prepared as a solution containing at least a photosensitizer and a PBO precursor dissolved in a solvent.

As preferred solvents, organic solvents such as N-methylpyrrolidone (NMP), γ-butyrolactone (GBL), N,N-dimethylacetamide (DMAc), dimethyl-2-piperidone, N,N-dimethylformamide (DMF), propylene glycol monomethyl ether (PGME), propylene glycol monomethyl ether acetate (PGMEA), propylene carbonate (PC), cyclohexanone (CH), ethyl lactate (EL), and mixtures of these solvents are exemplified, but the invention is not restricted thereto. More preferred solvents are γ-butyrolactone, N-methylpyrrolidone, propylene carbonate (PC), propylene glycol monomethyl ether acetate (PGMEA), and mixtures of these solvents.

The concentration of solids content (corresponding to all the solids content constituting the film after drying) in the photosensitive resin composition of the invention is generally from 15 to 50 mass %, and preferably from 25 to 45 mass %.

[5] Adhesion Accelerator and Other Additives:

For heightening the adhesion of a hardened film and a substrate, the photosensitive resin composition of the invention can contain organic silane compounds and aluminum chelate compounds. The examples of organic silane compounds include, e.g., γ-aminopropyltrimethoxysilane, γ-aminopropyl-triethoxysilane, vinyltriethoxysilane, γ-glycidoxypropyl-triethoxysilane, methylphenylsilanediol, ethylphenylsilane-diol, n-propylphenylsilanediol, isopropylphenylsilanediol, n-butylphenylsilanediol, isobutylphenylsilanediol, tert-butylphenylsilanediol, diphenylsilanediol, ethylmethyl-phenylsilanol, n-propylmethylphenylsilanol, isopropyl-methylphenylsilanol, n-butylmethylphenylsilanol, isobutyl-methylphenylsilanol, tert-butylmethylphenylsilanol, ethyl-n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyl-diphenylsilanol, n-butyldiphenylsilanol, isobutyldiphenyl-silanol, tert-butyldiphenylsilanol, phenylsilanetriol, 1,4-bis(trihydroxysilyl)benzene, 1,4-bis(methyldihydroxy-silyl)benzene, 1,4-bis(ethyldihydroxysilyl)benzene, 1,4-bis(propyldihydroxysilyl)benzene, 1,4-bis(butyl-dihydroxysilyl)benzene, 1,4-bis(dimethylhydroxysilyl)-benzene, 1,4-bis(diethylhydroxysilyl)benzene, 1,4-bis-(dipropylhydroxysilyl)benzene, 1,4-bis(dibutylhydroxy-silyl)benzene and the like. The examples of aluminum chelate compounds include, e.g., tris (acetylacetonate)aluminum, acetylacetatealuminumdiisopropylate and the like.

The addition amount of these adhesion-giving agents is preferably from 0.1 to 20 mass parts per 100 mass parts of the PBO precursor, and more preferably from 0.5 to 10 mass parts.

For the purpose of the improvements of coating property, e.g., prevention of striation (unevenness in film thickness), and developing property, the positive photosensitive resin composition of the invention can contain proper surfactants or leveling agents. As such surfactants or leveling agents, e.g., polyoxyethylene lauryl ether, polyoxyethylene stearyl ether, polyoxyethylene oleyl ether, and polyoxyethylene octylphenol ether are exemplified. As commercially available products, Megafac F171, F173, and R08 (trade names, manufactured by Dainippon Ink and Chemicals Inc.), Fluorad FC 430 and 431 (trade names, manufactured by Sumitomo 3M Limited), organosiloxane polymers KP341, KBM303, KBM403 and KBM803 (trade names, manufactured by Shin-Etsu Chemical Co., Ltd.) are exemplified.

It is also preferred for the photosensitive resin composition of the invention to further contain basic compounds, in particular nitrogen-containing organic basic compounds.

As basic compounds, organic amines, basic ammonium salts, basic sulfonium salts, basic iodonium salts and the like are used, and the same compounds as used in chemical amplification resists can be used.

As organic amines, e.g., primary, secondary and tertiary aliphatic amines, aromatic amines, heterocyclic amines such as imidazole derivatives, nitrogen-containing compounds having a carboxyl group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives, imide derivatives, a nitrogen-containing compounds having a cyano group, etc., are exemplified.

Basic compounds can be used alone or two or more kinds in combination.

The addition amount of basic compounds is generally from 0.01 to 30 mass % based on the photosensitizer, and preferably from 0.5 to 20 mass %.

[6] Pattern-Forming Method:

A method for forming a relief pattern with the photosensitive resin composition of the invention comprises (a) coating the photosensitive resin composition on an appropriate substrate, (b) baking the coated substrate, (c) irradiating the baked substrate with an actinic ray or radiation, (d) developing the exposed substrate with an aqueous developer, and (e) curing, whereby a cured relief pattern can be formed.

The coated and exposed substrate can also be baked at high temperature prior to development. Further, the developed substrate may be rinsed before curing.

A semiconductor device can be thus manufactured with the photosensitive resin composition of the invention by coating on a semiconductor element, prebaking, exposing, developing, and heat curing, so as to reach a prescribed thickness after heat curing (e.g., from 0.1 to 30 μm).

A method for forming a relief pattern is described in detail below.

The photosensitive resin composition of the invention is coated on a preferred substrate. The substrate is, e.g., semiconductor materials such as a silicon wafer, a ceramic substrate, glass, metal, or plastics. The coating methods include spray coating, rotary coating, offset printing, roller coating, screen printing, extrusion coating, meniscus coating, curtain coating, and immersion coating, but the coating method is not restricted thereto.

For evaporating the remaining solvent, the coated film is previously subjected to baking at high temperature of about 70 to 120° C. for several minutes to half an hour, according to the method. In the next place, the obtained dried film is subjected to exposure through a mask of a preferred pattern with an actinic ray or radiation. As the actinic ray or radiation, X-ray, electron beam, UV-ray, and visible ray can be used. The most preferred radiations are the radiations having wavelength of 436 nm (g-line) and 365 nm (i-line).

It is advantageous to heat the coated and exposed substrate at about 70 to 120° C. subsequent to exposure with the actinic ray or radiation. The coated and exposed substrate is heated for a short period of time, generally from several seconds to several minutes within the range of the temperature. This step of the method is in general technically called post-exposure baking.

In the next place, the coated film is developed with an aqueous developer to thereby form a relief pattern. As the aqueous developers, alkali solutions, e.g., inorganic alkalis (e.g., potassium hydroxide, sodium hydroxide, aqueous ammonia), primary amines (e.g., ethylamine, n-propylamine), secondary amines (e.g., diethylamine, di-n-propylamine), tertiary amines (e.g., triethylamine), alcohol amines (e.g., triethanolamine), quaternary ammonium salts (e.g., tetra-methylammonium hydroxide, tetraethylamonium hydroxide), and mixtures of these compounds are exemplified. The most preferred developers are those containing tetramethylammonium hydroxide. In addition, a proper amount of a surfactant may be added to the developer. For the development, immersion, spraying, paddling, or other similar development methods can be used.

According to circumstances, the relief pattern is then rinsed with deionized water. Subsequently, the relief pattern is cured for obtaining a final pattern of highly heat resisting polymer, whereby an oxazole ring is formed. Curing is carried out by baking the substrate at the glass transition temperature Tg of the polymer so as to obtain an oxazole ring forming a highly heat resisting final pattern. In general, temperature of higher than about 200° C. is used, and it is preferred to use temperature of from about 250 to 400° C.

EXAMPLE

The invention will be described more specifically with reference to examples.

Preparation of PBO Precursor:

Synthesis Example 1

Synthesis of Resin A-1

Into a three neck flask having a capacity of 3 liters are put 293 g (0.8 mol) of hexafluoro-2,2-bis(3-amino-4-hydroxyphenyl)propane (manufactured by Nippon Kayaku Co., Ltd.), 126.6 g (1.6 mol) of pyridine, and 1.2 kg of N-methyl-2-pyrrolidone (NMP). The mixed solution is stirred at room temperature and then cooled to −25° C. with a dry ice/acetone bath. To the solution is dripped, while maintaining the reaction temperature at −20 to −30° C., a mixed solution comprising 73.9 g (0.364 mol) of isophthaloyl chloride (manufactured by Tokyo Chemical Industry Co., Ltd.), 107.4 g (0.364 mol) of 4,4'-oxy-bisbenzoyl chloride (obtained by converting 4,4'-oxy-bisbenzoic acid (manufactured by Aldrich Corporation) to acid chloride according to ordinary method), and 700 g of NMP.

objective Resin A-1. The yield is 90%, and the number average molecular weight of Resin A-1 is $6.5 \times 10^3$ as polystyrene equivalent and the polydispersity is 2.1. It is confirmed from $^1$HNMR that terminal imido groups corresponding to CKK-1 are quantitatively introduced, and introduction of the trifluoromethanesulfonyl groups (5 mol % of the hydroxyl groups bonded to $X_3$) is also confirmed from FNMR and $^1$HNMR.

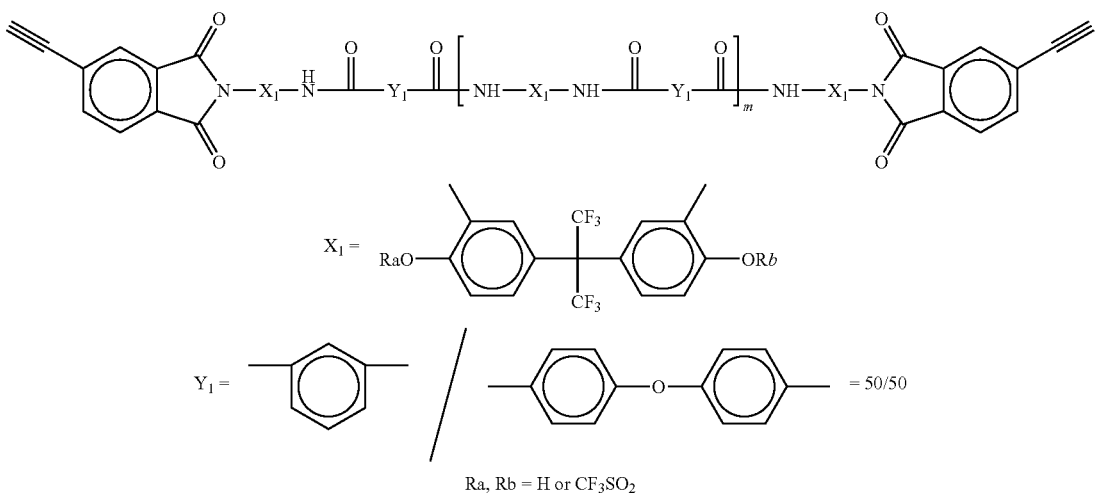

After completion of the addition, the resulting mixture is stirred at room temperature for 16 hours. The reaction solution is diluted with 2 liters of acetone, thrown into 50 liters of deionized water while vigorously stirring, and the precipitated white powder is recovered by filtration and washed with a mixture of deionized water and water/methanol (50/50 by mass). The polymer is dried under vacuum at 40° C. for 24 hours to obtain Resin a-1. The yield is almost quantitative, and the number average molecular weight of Resin a-1 is $6.4 \times 10^3$ as polystyrene equivalent and the polydispersity is 2.1.

The obtained Resin a-1 (400 g) is dissolved in NMP to obtain a 20 mass % solution. CKK-1 (45 g) (manufactured by Fuji Photo Film Co., Ltd.) and 30 g of pyridine are added to the solution, and the solution is stirred at 60° C. for 8 hours.

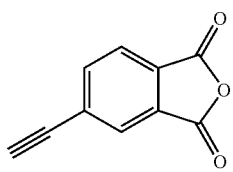

CKK-1

For the protection of the hydroxyl group, 13 g of trifluoromethanesulfonyl chloride (manufactured by Aldrich Corporation) and 10 g of pyridine are further added to the reaction solution and stirred for further 3 hours. After termination of the reaction, the reaction solution is dripped into 40 liters of distilled water to precipitate objective Resin A-1 (refer to the following structural formula). The precipitated Resin A-1 as pink powder is recovered by filtration, and dried to obtain

Synthesis Example 2

Synthesis of Resin A-2

Resin A-2 is synthesized with Resin a-1 obtained in Synthesis Example 1 in the same manner as in Synthesis Example 1 except for using CKK-2 in place of CKK-1.

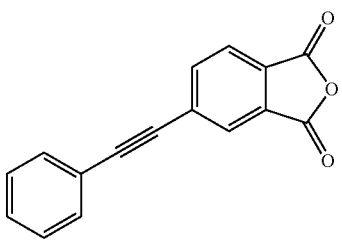

CKK-2

The number average molecular weight of Resin A-2 is $6.5 \times 10^3$ as polystyrene equivalent and the polydispersity is 2.1. It is confirmed from $^1$HNMR that terminal imido groups corresponding to CKK-2 are quantitatively introduced, and introduction of the trifluoromethanesulfonyl groups (5 mol % of the hydroxyl groups bonded to $X_3$) is also confirmed from FNMR and $^1$HNMR.

Synthesis Example 3

Synthesis of Resin A-3

Obtained Resin a-1 (400 g) is dissolved in a mixed solvent of 50/50 (mass ratio) of diglyme/PGMEA (propylene glycol monomethyl ether acetate) to obtain a 20 mass % solution. CKK-1 (45 g) (manufactured by Fuji Photo Film Co., Ltd.) and 30 g of pyridine are added to the solution, and the solution is stirred at 60° C. for 8 hours. Ethyl acetate is added to the obtained reaction solution, and the reaction solution is washed with water, and PGMEA is again added to the obtained organic solvent layer, the solvent is distilled off under reduced pressure at 60° C. to eliminate water content in the reaction system by azeotropic dehydration to thereby obtain a 15 mass % solution. The water content in the reaction system is 0.01 mass %. To the obtained solution are added 5 g of ethyl vinyl ether and 0.1 g of p-toluenesulfonic acid, and the solution is stirred at room temperature for 3 hours. Triethylamine (1 g) is added to the obtained solution, the reaction solution is washed with water three times and once diluted with 1 liter of PGMEA, and the solvent is distilled off under reduced pressure at 60° C. to eliminate water content in the reaction system by azeotropic dehydration to thereby obtain PGMEA solution having solid concentration of 40 mass % of Resin A-3. The number average molecular weight of Resin A-3 is $6.5 \times 10^3$ as polystyrene equivalent and the polydispersity is 2.1. It is confirmed from $^1$HNMR that CKK-1 is quantitatively introduced, and introduction of the ethylacetal groups into the hydroxyl groups (7 mol %) is also confirmed.

Synthesis Example 4

Synthesis of Resin A-4

Resin A-4 is synthesized in the same manner as in Synthesis Example 1 except for using the acid chloride shown below in place of 4,4'-oxy-bisbenzoyl chloride. The number average molecular weight of Resin A-4 is $6.2 \times 10^3$ as polystyrene equivalent and the polydispersity is 2.1. It is confirmed from $^1$HNMR that terminal imido groups corresponding to CKK-1 are quantitatively introduced, and introduction of the trifluoromethanesulfonyl groups (5 mol % of the hydroxyl groups bonded to $X_3$) is also confirmed from FNMR and $^1$HNMR.

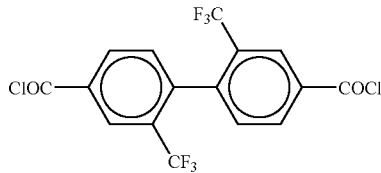

Synthesis Example 5

Synthesis of Resin A-5

Into a three neck flask having a capacity of 3 liters are put 293 g (0.8 mol) of hexafluoro-2,2-bis(3-amino-4-hydroxyphenyl)propane (manufactured by Nippon Kayaku Co., Ltd.), 126.6 g (1.6 mol) of pyridine, and 1.2 kg of N-methyl-2-pyrrolidone (NMP). The mixed solution is stirred at room temperature and then cooled to −25° C. with a dry ice/acetone bath. To the solution is dripped, while maintaining the reaction temperature at −20 to −30° C., a mixed solution comprising 73.9 g (0.364 mol) of isophthaloyl chloride (manufactured by Tokyo Chemical Industry Co., Ltd.), 107.4 g (0.364 mol) of 4,4'-oxy-bisbenzoyl chloride, and 700 g of NMP.

After completion of the addition, the resulting mixture is stirred at room temperature for 16 hours. CKK-1 (45 g) (manufactured by Fuji Photo Film Co., Ltd.) and 30 g of pyridine are added to the solution and stirred at room temperature for 8 hours.

The reaction solution is diluted with 2 liters of acetone, thrown into 50 liters of deionized water while vigorously stirring, and the precipitated white powder is recovered by filtration and washed with a mixture of deionized water and water/methanol (50/50 by mass). The polymer is dried under vacuum at 40° C. for 24 hours to obtain Resin a-5. The yield is almost quantitative, and the number average molecular weight of Resin a-5 is $6.5 \times 10^3$ as polystyrene equivalent and the polydispersity is 2.1.

The obtained Resin a-5 (400 g) is dissolved in NMP to obtain a 20 mass % solution. Trifluoromethanesulfonyl chloride (13 g) and 10 g of pyridine are further added to the reaction solution and stirred for further 3 hours. After termination of the reaction, the reaction solution is dripped into 40 liters of distilled water to precipitate objective Resin A-5. The precipitated Resin A-5 as pink powder is recovered by filtration, and dried to obtain objective Resin A-5. The yield is 90%, and the number average molecular weight of Resin A-5 is $6.6 \times 10^3$ as polystyrene equivalent and the polydispersity is 2.1. It is confirmed from $^1$HNMR that terminal groups shown below corresponding to CKK-1 are quantitatively introduced, and introduction of the trifluoromethanesulfonyl groups (5 mol %) is also confirmed from FNMR and $^1$HNMR.

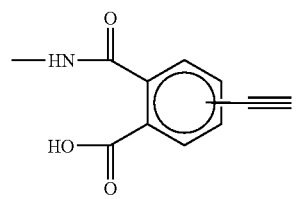

Synthesis Example 6

Synthesis of Resin A-6

Resin A-6 is synthesized with Resin a-1 obtained in Synthesis Example 1 in the same manner as in Synthesis Example 1 except for using norbornenedicarboxylic anhydride (manufactured by Aldrich Corporation) in place of CKK-1.

The number average molecular weight of Resin A-6 is $6.5 \times 10^3$ as polystyrene equivalent and the polydispersity is 2.1. It is confirmed from $^1$HNMR that terminal imido groups shown below are quantitatively introduced, and introduction of the trifluoromethanesulfonyl groups (5 mol %) is also confirmed from FNMR and $^1$HNMR.

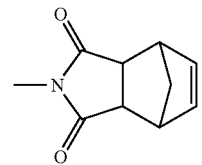

Synthesis of Photosensitizer:
(1) Synthesis of Photosensitizer (P-1):

Into a three neck flask are put 21.6 g of phenol compound (BP-1) and 200 ml of 1,4-dioxane and homogeneously dissolved. Subsequently, 27 g of 1,2-naphthoquinonediazide-4-sulfonyl chloride is added thereto and dissolved. The reaction vessel is cooled with ice water to 10° C., and then 11.1 g of triethylamine is dripped over 1 hour. After dripping, the reaction solution is stirred for 24 hours. After termination of the reaction, distilled water is added thereto to dissolve the precipitated salt, followed by stirring for 30 minutes. After neutralization with diluted hydrochloric acid, the reaction product is put into 1 liter of distilled water to be crystallized. The precipitated dark yellow powder is recovered by filtration. The recovered product is dissolved again in 200 ml of dioxane, and the solution is added to 1 liter of distilled water to be crystallized. The precipitated product is recovered by filtration, and washed with 1 liter of distilled water to recover 39 g of objective product (P-1) as dark yellow powder. As a result of analysis of obtained (P-1) by high performance liquid chromatography (S1525, manufactured by Waters Corporation), purity is confirmed to be 98% (detection wavelength: 254 nm).

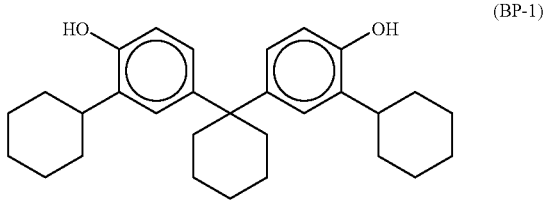

(BP-1)

(2) Synthesis of Photosensitizer (P-2):

Photosensitizer (P-2) is synthesized in the same manner as in the synthesis of (P-1) except that the phenol compound is changed to (BP-2) and the amount of 1,2-naphthoquinonediazide-4-sulfonyl chloride is doubled. As a result of analysis of obtained (P-2) by high performance liquid chromatography (S1525, manufactured by Waters Corporation), purity is confirmed to be 97.5% (detection wavelength: 254 nm).

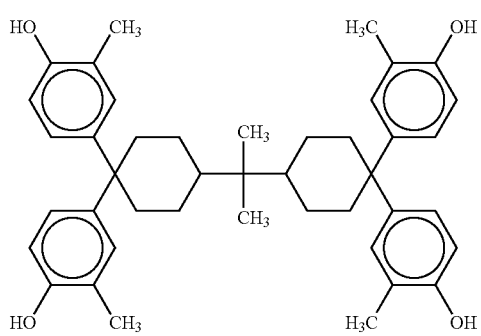

(BP-2)

Preparation of Photosensitive Resin Composition:

(1) Preparation of compositions 1 and 2:

Resin A-1 and Resin A-2 are used. In the first place, 12 mass % of the photosensitizers and 2 mass % of Adhesion Accelerator C shown below respectively based on the resins shown in Table 1 below, further 8 mass % of Phenol Compound DE in connection with composition 2, are dissolved in γ-butyrolactone to prepare 100 g of solutions having solids content concentration of 38 mass %. The obtained solutions are filtered through a PTFE cassette filter having a pore size of 0.1 μm to prepare photosensitive resin compositions 1 and 2.

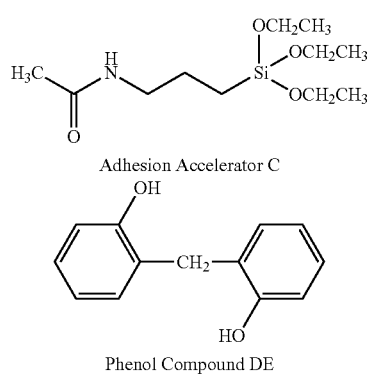

Adhesion Accelerator C

Phenol Compound DE (2) Preparation of Composition 3:

PGMEA solution of Resin A-3 is used, and 2 mass % of photosensitizer (oxime sulfonate, P-3) based on the resin, 5 mass % of triphenylimidazole based on the photosensitizer, and 2 mass % of Adhesion Accelerator C (alkoxysilane compound) based on the resin are dissolved in γ-butyrolactone to prepare 100 g of a solution having solids content concentration of 38 mass %. The obtained solution is filtered through a PTFE cassette filter having a pore size of 0.1 m to prepare photosensitive resin composition 3.

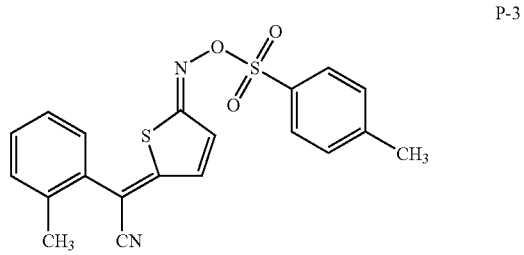

P-3

(3) Preparation of Comparative Composition:

A comparative composition is prepared in the same manner as in the preparation of composition 1 except for using resin a-1 obtained in Synthesis Example 1 in place of resin A-1.

(4) Evaluations of Sensitivity and Film Remaining Rate:

Each of the prepared compositions is coated on a silicon wafer by spin coating, and baked on a hot plate at 120° C. for 3 minutes to obtain a film having a thickness of 10 μm. The film is subjected to exposure with an i-line stepper through a mask of repeating pattern of via hole of 10 μm, provided that composition 3 alone is baked at 100° C. for 3 minutes, development with a 0.262N TMAH (tetramethylammonium hydroxide) aqueous solution, and then rinsing with deionized water. The exposure dose required to reproduce the pattern of via hole of 10 μm is taken as exposure sensitivity. The film remaining amount of unexposed area of a sample after drying is measured with an optical film thickness meter (FE-3000, manufactured by Otsuka Electronics Co., Ltd.) as a film thickness, and a film remaining rate is computed by dividing the obtained value with the film thickness before development.

(5) Evaluation of Pattern Deformation:

The pattern of via hole of 4 μm is heated at 200° C. for 30 minutes and 350° C. for 30 minutes under a nitrogen condition, and the size of the pattern of via hole of 4 μm is measured again, and the rate of fluctuation is taken as the rate of pattern deformation.

Rate of pattern deformation (%)=100×|size before heating−size after heating|/size before heating (6) Evaluation of Breaking Elongation:

Each of the prepared resin solutions is coated on a silicon wafer by spin coating, and baked on a hot plate at 120° C. for 3 minutes, and the resin solution is cured by further heating at 150° C. for 30 minutes and 350° C. for 1 hour under a nitrogen condition. The resin film is peeled off the obtained wafer, and cut to a size of 3 mm in width and 7 cm in length.

The both ends each by 1 cm of the obtained sample is fixed and stretched with a TENSILON (1 mm/min), and the coefficient of elongation until breaking (breaking elongation) is measured at 23° C. in accordance with JIS K 6760.

(7) Evaluation of Thermal Expansion Coefficient:

Thermal expansion coefficient of a sample prepared similarly to the time of the measurement of breaking elongation (size: 10 mm×3 mm) is measured with TMA Q400 (manufactured by TA Instrument).

TABLE 1

| Example No. | Composition Resin | Composition Photosensitizer | Composition Phenol Compound | Sensitivity (mJ/cm²) | Film Remaining Rate (%) | Pattern Deforming Rate (%) | Breaking Elongation (%) | Thermal Expansion Coefficient (ppm/K) |
|---|---|---|---|---|---|---|---|---|
| Example 1 | A-1 | P-1 | — | 340 | 92 | 1 | 91 | 55 |
| Example 2 | A-2 | P-2 | DE | 350 | 89 | 2 | 85 | — |
| Example 3 | A-3 | P-3 | — | 210 | 97 | 1 | 90 | — |
| Example 4 | A-4 | P-1 | — | 390 | 95 | 1 | 81 | 38 |
| Comparative Example 1 | a-1 | P-1 | — | 330 | 48 | 12 | 43 | — |
| Comparative Example 2 | A-5 | P-1 | — | 320 | 68 | 15 | 61 | — |
| Comparative Example 3 | A-6 | P-1 | — | 360 | 81 | 11 | 59 | — |

The photosensitive resin compositions in the invention are excellent in the balance of sensitivity and a film remaining rate, thermal deformation of pattern is little, so that stable pattern formation is possible. It can be seen that the photosensitive resin compositions are excellent in breaking elongation.

The photosensitive resin composition containing a polybenzoxazole precursor in the invention is high sensitivity, high in a film remaining rate, and excellent in breaking elongation, and capable of manufacturing a relief structure having high heat resistance, mechanical characteristics, electrical characteristics and chemical resistance, and can be preferably used for semiconductor use, in particular as a buffer coat.

The entire disclosure of each and every foreign patent application from which the benefit of foreign priority has been claimed in the present application is incorporated herein by reference, as if fully set forth.

What is claimed is:

1. A photosensitive resin composition comprising:
a photosensitizer; and
a polybenzoxazole precursor represented by the following formula (1):

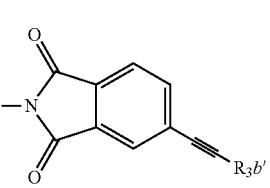

wherein $R_3a'$ and $R_3b'$ may be the same or different, and each of them represents a hydrogen atom or a phenyl group;

$X_1$ represents a group represented by formula (2) or (3):

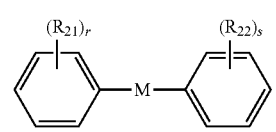

$X_2$ represents a divalent aromatic group, heterocyclic group, alicyclic group, or aliphatic group, each of which may contain a silicon atom;

$X_3$ represents a tetravalent aromatic group, aliphatic group, heterocyclic group, or mixed group thereof;

Ra and Rb each independently represents a hydrogen atom, an alkyl group, an acyl group, $SO_2Rc$, a group capable of leaving by the action of an acid, or $-C(R_3)_2-COOR_4$;

Rc represents an alkyl group, an aryl group, or an alicyclic group;

$R_3$ represents a hydrogen atom or an alkyl group having from 1 to 4 carbon atoms;

$R_4$ represents a group capable of leaving by the action of an acid;

$Y_1$ represents a divalent aromatic group, aliphatic group, heterocyclic group, or mixed group thereof;

each groups represented by $X_1$, $X_2$, $X_3$, $Y_1$, Ra, Rb, Rc, $R_3$ and $R_4$ may be the same or different; and m represents an integer of from 3 to 1,000, wherein at least one of the groups represented by $X_1$ and the groups represented by $Y_1$ in the formula (1) comprises a structure represented by the following formula (A2-2):

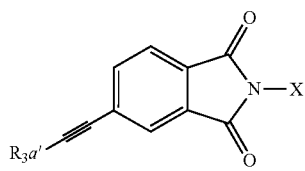

wherein M represents a single bond or a divalent group;

$R_{21}$ and $R_{22}$ each independently represents a fluorine atom or a univalent organic group;

r and s each independently represents an integer of from 1 to 4; and the addition amount of the polybenzoxazole precursor is from 50 to 99.5 mass % based on the total solids content of the photosensitive resin composition.

2. The photosensitive resin composition according to claim 1, wherein at least one of the groups represented by $X_1$ and the groups represented by $Y_1$ in the formula (1) is a group selected from the following groups:

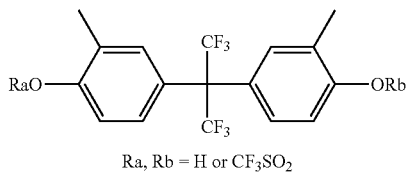

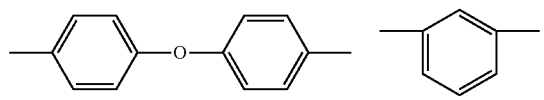

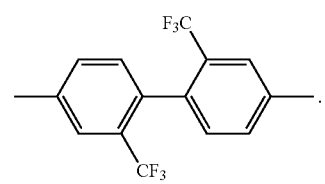

3. The photosensitive resin composition according to claim 2, wherein at least one of the groups represented by $X_1$ and the groups represented by $Y_1$ in the formula (1) is a group selected from the following groups:

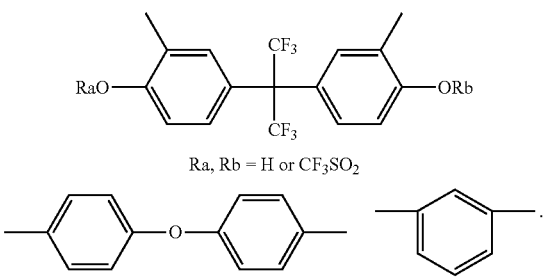

4. The photosensitive resin composition according to claim 1, wherein the photosensitizer is a compound selected from the following compounds P-1 to P-3:

P-1: a reaction product of the following compound (BP-1) with 1,2-naphthoquinonediazide-4-sulfonyl chloride;

P-2: a reaction product of the following compound (BP-2) with 1,2-naphthoquinonediazide-4-sulfonyl chloride:

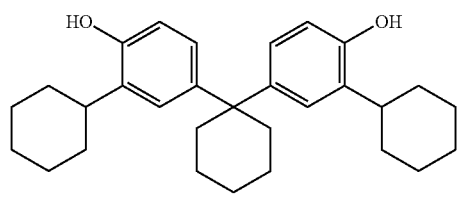

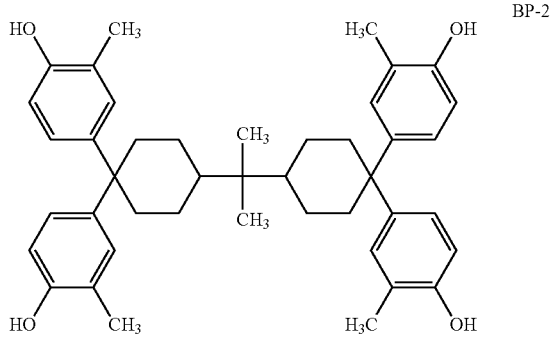

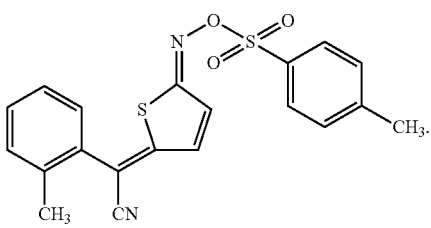

5. The photosensitive resin composition according to claim 1, wherein the photosensitive resin composition further contains at least one phenol compound selected from the group consisting of a phenol compound having a structure represented by formula (3-1) and a phenol compound having a structure represented by formula (3-2):

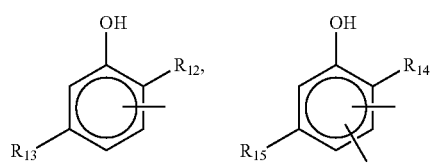

wherein in formula (3-1), R12 to R15 each represents an alkyl group, an alkoxy group or a cycloalkyl group;

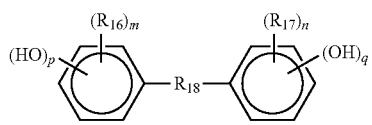

wherein in formula (3-2), $R_{16}$ and $R_{17}$ each represents a halogen atom, an alkyl group, an alkoxy group, an alkyl ester group, a cycloalkyl group or a cycloalkoxy group;

m and n each represents an integer of from 0 to 5;

when two or more $R_{16}$ and $R_{17}$ are present, they may be the same or different;

p and q each represents an integer of from 0 to 3, and $p+q \geq 2$; and $R_{18}$ represents a single bond, a methylene group, an alkylene group, an oxygen atom, a carbonyl group, a carbonyl ether group, a sulfur atom, a sulfonyl group or an azo group.

6. A manufacturing method of a semiconductor device comprising:
   a process of coating the photosensitive resin composition according to claim 1 on a semiconductor element;
   a process of prebaking;
   a process of exposure;
   a process of development; and
   a process of heating.

* * * * *